(12) United States Patent
Nasman et al.

(10) Patent No.: US 12,506,019 B2
(45) Date of Patent: Dec. 23, 2025

(54) WAFER CHUCK DESIGNS AND METHODS FOR RETAINING A PROCESSING LIQUID ON A SURFACE OF A SEMICONDUCTOR WAFER

(71) Applicant: Tokyo Electron Limited, Tokyo (JP)

(72) Inventors: Ronald Nasman, Albany, NY (US); Peter D'Elia, Albany, NY (US); Shan Hu, Albany, NY (US); James Grootegoed, Albany, NY (US); Rodney Robison, Albany, NY (US); Anton Devilliers, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 120 days.

(21) Appl. No.: 18/601,258

(22) Filed: Mar. 11, 2024

(65) Prior Publication Data

US 2025/0285883 A1    Sep. 11, 2025

(51) Int. Cl.
*H01L 21/67* (2006.01)
*H01L 21/683* (2006.01)

(52) U.S. Cl.
CPC .... *H01L 21/67051* (2013.01); *H01L 21/6833* (2013.01); *H01L 21/6838* (2013.01)

(58) Field of Classification Search
None
See application file for complete search history.

(56) References Cited

U.S. PATENT DOCUMENTS

| | | | |
|---|---|---|---|
| 6,373,679 B1 * | 4/2002 | Qiao | H02N 13/00 361/233 |
| 6,578,853 B1 | 6/2003 | Treur et al. | |
| 6,793,836 B2 | 9/2004 | Tsung-Kuei et al. | |
| 7,354,484 B2 | 4/2008 | Orii et al. | |
| 8,813,764 B2 | 8/2014 | Magni et al. | |
| 10,048,664 B2 | 8/2018 | Hasimoto et al. | |

(Continued)

FOREIGN PATENT DOCUMENTS

| JP | 6085423 | 2/2017 |
|---|---|---|
| JP | 2021197456 | 12/2021 |

OTHER PUBLICATIONS

Hu et al., "Methods For Retaining A Processing Liquid On A Surface Of A Semiconductor Substrate", U.S. Appl. No. 18/112,120, filed Feb. 21, 2023, 57 pgs.

(Continued)

*Primary Examiner* — Eric W Golightly
(74) *Attorney, Agent, or Firm* — Egan, Enders & Huston LLP.

(57) ABSTRACT

Improved wafer chuck designs and methods are provided herein for retaining a processing liquid on a surface of a semiconductor substrate during a puddle process. More specifically, the present disclosure provides various embodiments of wafer chucks that reshape a surface of a semiconductor substrate to ensure that the substrate surface is concave (or completely flat) before a processing liquid is dispensed onto the substrate surface to form a puddle of the processing liquid on the substrate surface. By providing the substrate surface with a concave (or completely flat) shape, the embodiments disclosed herein provide complete chemical coverage across the substrate surface during a puddle process, retain the puddle on the substrate surface and prevent the puddle from spilling over the substrate edge.

22 Claims, 11 Drawing Sheets

(56) References Cited

U.S. PATENT DOCUMENTS

| | | |
|---|---|---|
| 11,460,775 B2 | 10/2022 | Kang et al. |
| 2002/0023590 A1 | 2/2002 | Storbeck |
| 2005/0035514 A1 | 2/2005 | Hillman et al. |
| 2014/0017903 A1 | 1/2014 | Bello et al. |
| 2014/0045340 A1* | 2/2014 | Burgess ............ H01L 21/67253 |
| | | 438/758 |
| 2019/0244836 A1 | 8/2019 | Wang et al. |
| 2020/0073244 A1 | 3/2020 | Kang et al. |
| 2022/0371048 A1 | 11/2022 | Miyakubo |
| 2023/0120387 A1 | 4/2023 | Mizunaga et al. |

OTHER PUBLICATIONS

Notification Of Transmittal Of The International Search Report And The Written Opinion Of The International Searching Authority, Or The Declaration, Filing Date Jan. 17, 2025, PCT/US2025/012044; May 7, 2025; 10 pgs.

* cited by examiner

MOUNT SUBSTRATE ON WAFER CHUCK

ACTIVATE WAFER CHUCK

PUDDLE PROCESS

DISPENSE ADD'L PROCESSING LIQUID(S)
ONTO THE FRONTSIDE SURFACE

SPIN-DRY STEP

MOUNT SUBSTRATE ON WAFER CHUCK OR
DEACTIVATE WAFER CHUCK TO UNCLAMP SUBSTRATE

DISPENSE LIQUID ONTO THE BACKSIDE SURFACE

ACTIVATE WAFER CHUCK AND/OR PERFORM SPIN-DRY STEP

IPA PUDDLE PROCESS

WAFER TRANSFER

DRY STEP

MOUNT SUBSTRATE ON WAFER CHUCK
AND ACTIVATE WAFER CHUCK TO CLAMP SUBSTRATE

FRONTSIDE PUDDLE PROCESS

BACKSIDE PROCESS

WAFER CHUCK DESIGNS AND METHODS FOR RETAINING A PROCESSING LIQUID ON A SURFACE OF A SEMICONDUCTOR WAFER

BACKGROUND

The present disclosure relates to the processing of semiconductor substrates. In particular, it provides novel wafer chuck designs and methods for retaining a processing liquid on a surface of a semiconductor substrate.

Semiconductor fabrication processes involve a wide variety of processing steps, including depositing, growing, patterning, etching, coating, developing and cleaning steps. Some of these processing steps may be spin-on processes, which are performed on a semiconductor substrate while the semiconductor substrate is disposed within a wet processing chamber having a spin chuck and at least one liquid dispense nozzle.

FIG. 1A illustrates an example of a wet processing system 100 that can be used to process a semiconductor substrate. The wet processing system 100 shown in FIG. 1 is a spin chamber, which uses a spin chuck 110 and drive mechanism 115 (e.g., a stepper motor) to rotate or spin a semiconductor substrate (or wafer W) mounted onto the spin chuck 110, at least one liquid nozzle 120 for dispensing one or more liquids (L) received from a liquid supply line 125 onto the substrate surface while the semiconductor substrate is spinning, and a large cup 130 for capturing the liquids that are ejected from the substrate surface(s) by the centrifugal forces generated during rotation of the spin chuck 110. The liquid material ejected from the semiconductor substrate W and collected by the cup 130 is drained via a drain line 135 and drain unit (not shown). An exhaust line 137 and exhaust unit (not shown), such as a vacuum pump or other negative pressure-generating device, is provided within the wet processing system 100 to remove gaseous species (including but not limited to vapors released from substrate layers during processing) from the processing space inside the cup 130.

Standard spin-on processes expose a semiconductor substrate to a continuous stream of processing liquid for a period of time while the substrate is spinning at relatively high rotational speeds (e.g., 200 to 3000 rotations per minute, RPM). For example, the at least one liquid nozzle 120 shown in FIG. 1A may be used to dispense a processing liquid onto the surface of the semiconductor substrate W at a continuous flow of 1000 mL/min for 60 seconds, while the substrate is spinning at 2000 RPM to perform a variety of wet processes (e.g., a cleaning process, an etching process, a developing process, etc.). In this example, the wet process would consume approximately 1 liter (L) of processing liquid.

In some cases, a puddle of processing liquid can be formed on the substrate surface during a wet process to reduce the amount of liquid needed to perform the wet process, improve the process performance, etc. For example, the at least one liquid nozzle 120 shown in FIG. 1A may be used to dispense a processing liquid onto the surface of the semiconductor substrate W while the substrate is stationary, or rotating at relatively low rotational speeds (e.g., 0-50 rotations per minute, RPM), to form a puddle of the processing liquid on the substrate surface. In some cases, use of a puddle may reduce the amount of liquid needed to perform the wet process by 50% or more.

When performing a puddle process, it is generally desirable to maintain complete chemical coverage within a center region (or active area) of the semiconductor substrate W. However, complete chemical coverage is difficult to achieve/maintain in conventional puddle processes, since liquids tend to fall off the edge of the substrate (even when the substrate is stationary), due to the low surface tension of the liquids dispensed onto the substrate, the hydrophobicity of the substrate surface and/or the presence of beveled edges at the periphery of the substrate.

FIG. 1B illustrates a portion of the semiconductor substrate W shown in box 140 of FIG. 1A. As shown in FIG. 1B, the semiconductor substrate W includes a frontside surface 150, a backside surface 160, a side edge surface 170 and a beveled edge region 180. The beveled edge region 180 includes a front beveled edge 182 which slopes from the frontside surface 150 to the side edge surface 170, and a back beveled edge 184 which slopes from the backside surface 160 to the side edge surface 170. When a processing liquid (L) is dispensed onto a surface (e.g., the frontside surface 150) of the semiconductor substrate W while the substrate is stationary, or rotating at relatively low rotational speeds, to form a puddle on the substrate surface, the relatively low surface tension of the processing liquid and/or the beveled edges 182/184 of the semiconductor substrate W may cause a portion of the processing liquid to spill over the edge of the substrate. This prevents the puddle process from maintaining complete chemical coverage within the center region of the semiconductor substrate W.

Other process conditions, such as bowing or warpage of the substrate surface, variations in hydrophobicity of the substrate surface and level of the spin chuck 110, can also cause the puddle to spill over the substrate edge or form an uneven puddle perimeter, all of which may adversely affect puddle process performance.

A need, therefore, remains for improved wafer chuck designs and methods for retaining a processing liquid on a surface of a semiconductor substrate during a puddle process.

SUMMARY

The present disclosure provides improved wafer chuck designs and methods for retaining a processing liquid on a surface of a semiconductor substrate during a puddle process. More specifically, the present disclosure provides various embodiments of wafer chucks that reshape a surface of a semiconductor substrate to ensure that the substrate surface is concave (or completely flat) before a processing liquid is dispensed onto the substrate surface to form a puddle of the processing liquid on the substrate surface. By providing the substrate surface with a concave (or completely flat) shape, the embodiments disclosed herein provide complete chemical coverage across the substrate surface during a puddle process, retain the puddle on the substrate surface and prevent the puddle from spilling over the substrate edge.

According to one embodiment, a method is provided herein for retaining a processing liquid on a surface of a semiconductor substrate. In some embodiments, the method may begin by receiving the semiconductor substrate within a first processing chamber and mounting the semiconductor substrate onto a wafer chuck disposed within the first processing chamber. The semiconductor substrate may generally include a frontside surface, a backside surface, a peripheral edge region, a frontside center region that extends from a center of the frontside surface to the peripheral edge region and a backside center region that extends from a center of the backside surface to the peripheral edge region.

The wafer chuck may generally include: (i) a central planar region positioned below the backside center region of the semiconductor substrate, and (ii) an edge support region positioned below the peripheral edge region of the semiconductor substrate. In some embodiments, the wafer chuck may further include a fluid flow channel, which is coupled to the central planar region and used to provide a fluid to, and/or remove a fluid from, the backside surface of the semiconductor substrate. The fluid may be a gas or a liquid.

The method may further include activating the wafer chuck to clamp the backside center region of the semiconductor substrate onto the central planar region of the wafer chuck and elevate the peripheral edge region of the semiconductor substrate above the frontside center region of the semiconductor substrate to ensure that the frontside surface is concave, and dispensing a first processing liquid onto the frontside surface of the semiconductor substrate after activating the wafer chuck to form a puddle of the first processing liquid that covers an entirety of the frontside surface. The method retains the puddle of the first processing liquid on the frontside surface by activating the wafer chuck and ensuring the frontside surface of the semiconductor substrate is concave prior to dispensing the first processing liquid on the frontside surface.

In general, the wafer chuck can be activated by applying a vacuum pressure or an electrostatic charge to the wafer chuck. In some embodiments, a vacuum pressure can be applied to the wafer chuck by removing gas from the backside surface of the semiconductor substrate to generate the vacuum pressure. In other embodiments, a vacuum pressure can be applied to the wafer chuck by providing a liquid to the backside surface of the semiconductor substrate and subsequently removing the liquid to generate the vacuum pressure. In some embodiments, the edge support region of the wafer chuck may include an annular support ring or a plurality of support pins, and the wafer chuck can be further activated by mechanically lifting the annular support ring or the plurality of support pins to elevate the peripheral edge region of the semiconductor substrate above the frontside center region of the semiconductor substrate.

In some embodiments, the puddle of the first processing liquid may be formed by dispensing the first processing liquid onto the frontside surface of the semiconductor substrate while the wafer chuck is stationary or spinning at a first rotational speed ranging between 0 to 50 rotations per minute (RPM). In some embodiments, the puddle of the first processing liquid may be dispersed across the frontside surface of the semiconductor substrate by spinning the wafer chuck at the first rotational speed. In other embodiments, the puddle of the first processing liquid may be dispersed across the frontside surface of the semiconductor substrate by tilting the wafer chuck while spinning the wafer chuck at the first rotational speed. In some embodiments, the method may further include heating the wafer chuck to ensure that the puddle of the first processing liquid maintains a uniform temperature across the frontside surface of the semiconductor substrate.

In some embodiments, the method may further include dispensing a second processing liquid onto the frontside surface of the semiconductor substrate while spinning the wafer chuck at a second rotational speed, which is greater than the first rotational speed, to remove the first processing liquid from the frontside surface of the semiconductor substrate. For example, the first processing liquid may be an etching solution or a cleaning solution, and the second processing liquid may be a rinsing solution or a drying solution, which is dispensed onto the frontside surface of the semiconductor substrate to remove the etching solution, remove the cleaning solution and/or dry the semiconductor substrate. In some embodiments, the method may further include spinning the wafer chuck to remove the second processing liquid from the frontside surface of the semiconductor substrate and spin-dry the semiconductor substrate.

In some embodiments, the method may further include deactivating the wafer chuck before, during or after dispensing the second processing liquid onto the frontside surface of the semiconductor substrate to release the backside center region of the semiconductor substrate from the central planar region of the wafer chuck. The wafer chuck can be deactivated by removing the vacuum pressure or the electrostatic charge applied to the wafer chuck. In some embodiments, the edge support region of the wafer chuck may include an annular support ring or a plurality of support pins, and the wafer chuck can be further deactivated by mechanically lowering the annular support ring or the plurality of support pins to release the peripheral edge region of the semiconductor substrate.

In some embodiments, the method may further include dispensing a third processing liquid onto the backside surface of the semiconductor substrate after the wafer chuck is deactivated to clean the backside surface. For example, when the first processing liquid is an etching solution or a cleaning solution and the second processing liquid is a rinsing solution or a drying solution, the third processing liquid can be a cleaning solution, which is dispensed onto the backside surface of the semiconductor substrate to clean the backside surface. In some embodiments, the method may further include spinning the wafer chuck to spin-dry the semiconductor substrate after dispensing the third processing liquid onto the backside surface of the semiconductor substrate.

In some embodiments, the method may dispense the second processing liquid onto the frontside surface of the semiconductor substrate while the wafer chuck is stationary or spinning at the first rotational speed to form a puddle of the second processing liquid that covers an entirety of the frontside surface. For example, the first processing liquid may be an etching solution or a cleaning solution, and the second processing liquid may be a drying solution. The first and second processing liquids can be dispensed onto the frontside surface of the semiconductor substrate while the substrate is disposed within the first processing chamber. In some embodiments, the method may transfer the semiconductor substrate from the first processing chamber to a second processing chamber after the second processing liquid is dispensed onto the frontside surface of the semiconductor substrate to form the puddle of the second processing liquid. The method retains the puddle of the second processing liquid on the frontside surface during said transferring by activating the wafer chuck and ensuring that the frontside surface of the semiconductor substrate is concave prior to dispensing the second processing liquid on the frontside surface.

In some embodiments, the first processing chamber may be a wet processing chamber and the second processing chamber may be a supercritical processing chamber. In such embodiments, the method may further include treating a surface of the semiconductor substrate with supercritical carbon dioxide ($CO_2$) and drying the surface of the semiconductor substrate within the supercritical processing chamber.

Various embodiments of methods are provided herein for processing a substrate, and more specifically, for retaining a puddle of processing liquid on a surface of a semiconductor substrate during a puddle process. Of course, the order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this Summary section does not specify every embodiment and/or incrementally novel aspect of the present disclosure or claimed inventions. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

The present disclosure provides improved wafer chuck designs and methods for retaining a processing liquid on a surface of a semiconductor substrate during a puddle process. More specifically, the present disclosure provides various embodiments of wafer chucks that reshape a surface of a semiconductor substrate to ensure that the substrate surface is concave (or completely flat) before a processing liquid is dispensed onto the substrate surface to form a puddle of the processing liquid on the substrate surface. By providing the substrate surface with a concave (or completely flat) shape, the embodiments disclosed herein provide complete chemical coverage across the substrate surface during a puddle process, retain the puddle on the substrate surface and prevent the puddle from spilling over the substrate edge.

Figure 2A:
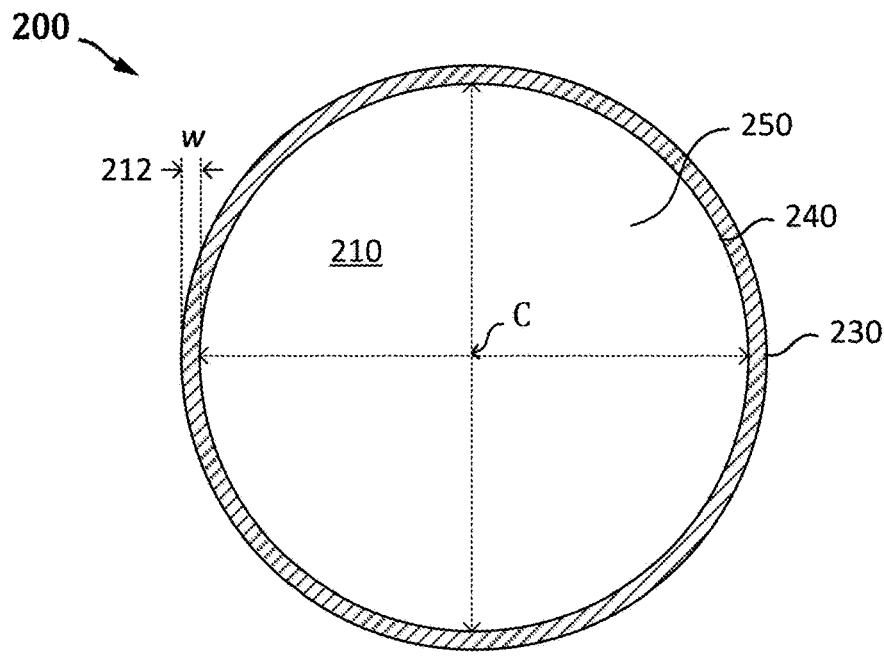
FIG. 2A is a top down view of a semiconductor substrate having a frontside surface, a backside surface (shown in FIG. 2C), a side edge surface, a peripheral edge region and a frontside center region.
Figure 2B:
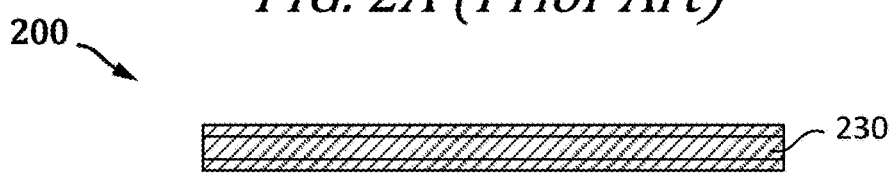
FIG. 2B is a side view of the semiconductor substrate shown in FIGS. 2A and 2C, illustrating the side edge surface of the substrate.
Figure 2C:
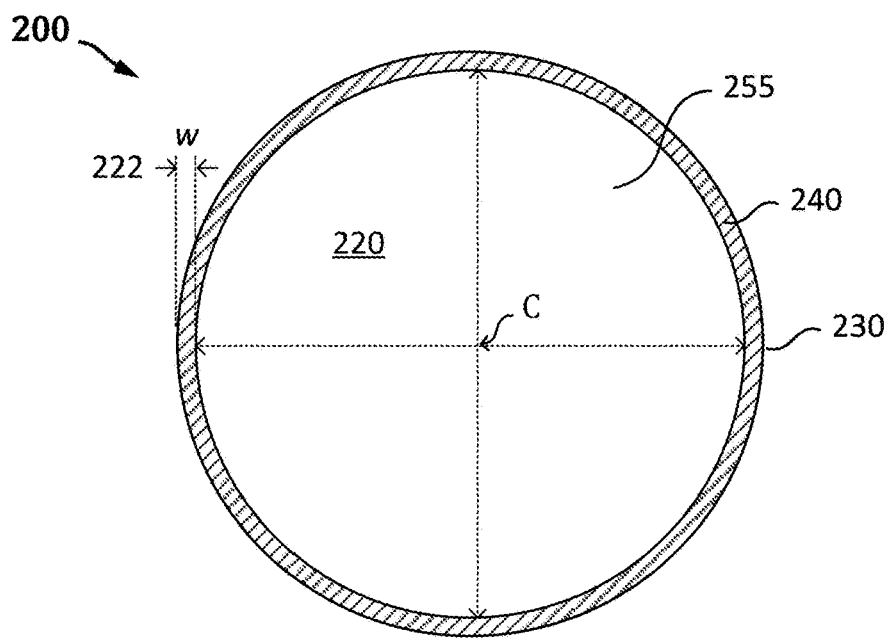
FIG. 2C is a bottom up view of the semiconductor substrate having a frontside surface (shown in FIG. 2A), a backside surface, a side edge surface, a peripheral edge region and a backside center region.

A semiconductor substrate 200 (or wafer, W) is illustrated in FIGS. 2A-2C. The semiconductor substrate 200 may be any substrate for which the use of patterned features is desirable. In one embodiment, the semiconductor substrate 200 may be a semiconductor substrate having one or more semiconductor processing layers formed thereon. For example, semiconductor substrate 200 may be a substrate that has been subjected to multiple semiconductor processing steps which yield a wide variety of structures and layers, all of which are known in the substrate processing art. In another embodiment, semiconductor substrate 200 may be a silicon substrate or other bulk substrate comprising a layer of semi-conductive material. The semiconductor substrate 200 shown in FIGS. 2A-2C is disc-shaped and has a diameter ranging, for example, between approximately 25 mm and 300 mm (or larger).

Figure 1A:
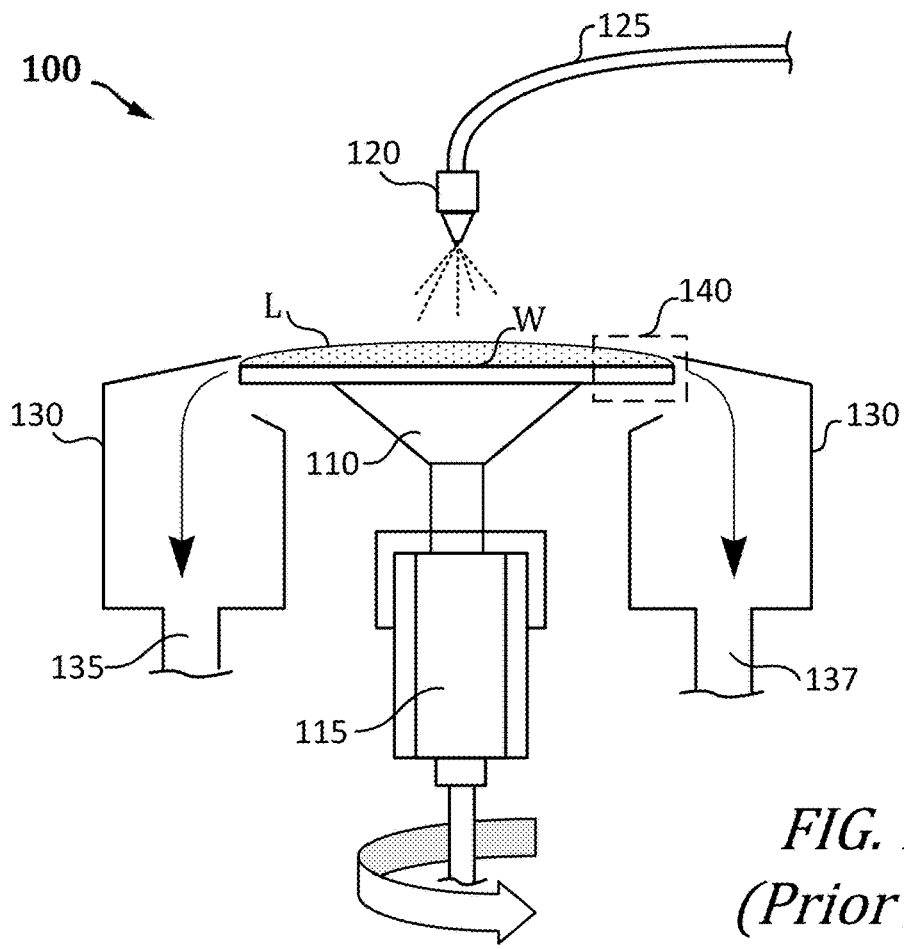
FIG. 1A (PRIOR ART) illustrates one example of a wet processing system having a spin chuck for supporting and rotating a semiconductor substrate (W) and at least one liquid nozzle for dispensing a liquid onto a surface of the semiconductor substrate.
Figure 1B:
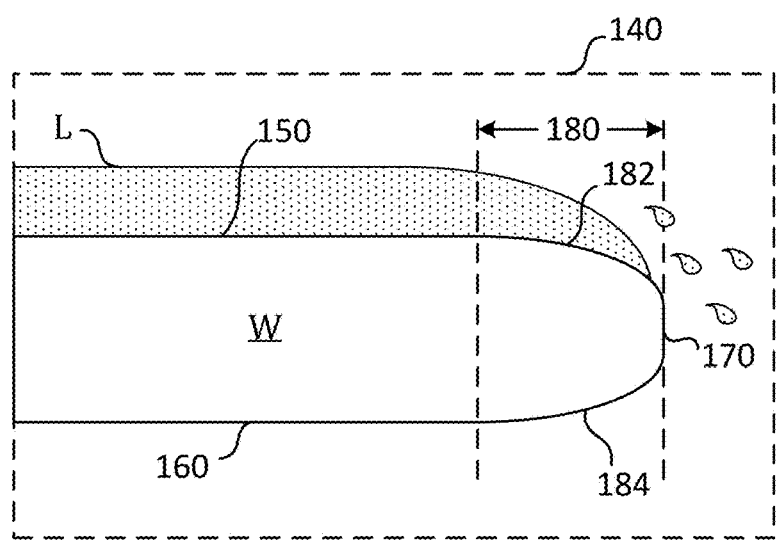
FIG. 1B (PRIOR ART) illustrates a portion of the semiconductor substrate (W) shown in box 140 of FIG. 1A.

The semiconductor substrate 200 has a frontside surface 210, a backside surface 220, a side edge surface 230, a peripheral edge region 240, a frontside center region 250 on the frontside surface 210 and a backside center region 255 on the backside surface 220. As shown in FIGS. 2A-2C, the peripheral edge region 240 of the semiconductor substrate 200 includes an outer annular portion 212 of the frontside surface 210, the side edge surface 230, and an outer annular portion 222 of the backside surface 220. The annular portions 212/222 of the frontside surface 210 and the backside surface 220 are located at the periphery of the semiconductor substrate 200 adjacent to the side edge surface 230. A width (w) of the annular portions 212/222 of the frontside surface 210 and the backside surface 220 is small compared to the diameter (e.g., 300 mm) of the semiconductor substrate 200. For example, the width (w) of the annular portions 212/222 of the frontside surface 210 and the backside surface 220 may range between approximately 1-5 mm. In some embodiments, the annular portions 212/222 of the frontside surface 210 and the backside surface 220 may be beveled, or may include beveled edges, as shown for example in FIG. 1B.

As shown in FIG. 2A, the frontside center region 250 on the frontside surface 210 of the semiconductor substrate 200 extends from the center (C) of the semiconductor substrate 200 to the peripheral edge region 240. A wide variety of processing steps, such as film deposition, patterning, etching, ion implantation, cleaning, etc., may be performed on the frontside surface 210 of the semiconductor substrate 200 to form various film layers, semiconductor structures and active circuit components within the frontside center region 250. In other words, the frontside center region 250 is the region of the semiconductor substrate 200 where semiconductor structures, or active circuit components, are typically formed. Unlike the frontside center region 250, no semiconductor structures or active circuit components are formed within the peripheral edge region 240 of the semiconductor substrate 200.

As shown in FIG. 2C, the backside center region 255 on the backside surface 220 of the semiconductor substrate 200 also extends from the center (C) of the semiconductor substrate 200 to the peripheral edge region 240. In some IC fabrication processes, the backside surface 220 of the semiconductor substrate 200 may be subjected to various processing steps to deposit film layers on the backside surface 220 (e.g., to control wafer planarity or form structures on the backside surface), clean the backside surface 220 (e.g., to remove contaminants) or perform other backside wafer processing.

In some cases, processing performed on the frontside surface 210 and/or the backside surface 220 may affect the planarity of the semiconductor substrate 200. For example, multiple processing steps can be executed to form structures on material layers formed on the semiconductor substrate 200. These processing steps can include depositing material on the substrate, exposing the substrate to actinic radiation, removing material from the substrate, implanting dopants, annealing, baking, and so forth. The different materials and structural formations can cause internal stresses in the substrate which may result in bowing of the substrate, warping of the substrate or difference in substrate thickness.

As noted above, puddle processes are commonly used in a variety of wet processes (e.g., cleaning processes, etching processes, developing process, etc.) to reduce the amount of processing liquid needed to perform the wet process, improve the process performance, etc. In a puddle process, a processing liquid is dispensed onto a substrate surface while the substrate is stationary or rotating at low rotational speeds (e.g., 0 to 50 RPM) to form a puddle of the processing liquid, which is left on the substrate surface for a predetermined amount of time. However, puddle processing is oftentimes challenging. For example, a puddle may not cover the entire substrate surface, especially at the edge of the substrate, if the puddle finds a point on the perimeter of the substrate to spill over. This occurs often on substrates with hydrophobic surfaces. Other process conditions, such as substrate bowing or warpage, varying edge conditions or chuck level may also inhibit full chemical coverage or induce spill over. Thus, it is often difficult to provide complete chemical coverage across the substrate surface during a puddle process, while simultaneously retaining the puddle on the substrate surface and preventing the puddle from spilling over the substrate edge.

Figure 3:
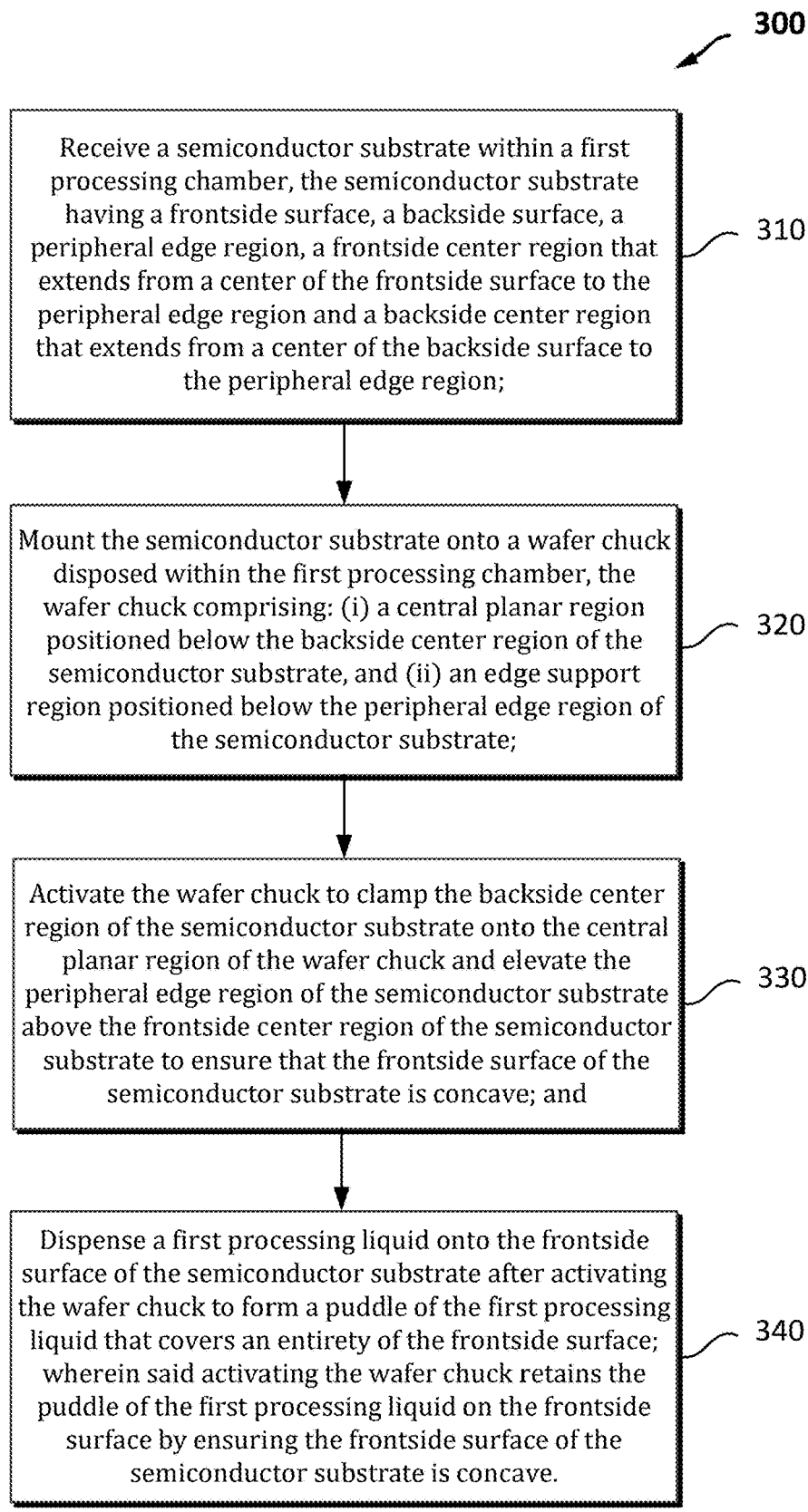
FIG. 3 is a flowchart diagram illustrating one embodiment of a method that utilizes the techniques described herein to retain a processing liquid on a surface of a semiconductor substrate.

FIG. 3 illustrates one embodiment of a method 300 that utilizes the techniques described herein to retain a processing liquid on a surface of a semiconductor substrate, such as semiconductor substrate 200 shown in FIGS. 2A-2C, during a puddle process. The method 300 shown in FIG. 3 can be performed within a variety of wet processing chambers. In one embodiment, the method 300 shown in FIG. 3 may be performed within a spin chamber similar to that shown in FIG. 1A and described above. It is recognized, however, that the method 300 may be performed within other wet processing chambers and systems, as is known in the art.

In the embodiment shown in FIG. 3, the method 300 begins by receiving a semiconductor substrate (or wafer, W) within a first processing chamber (in step 310) and mounting the semiconductor substrate onto a wafer chuck disposed within the first processing chamber (in step 320). The semiconductor substrate received in step 310 may generally include a frontside surface 210, a backside surface 220, a peripheral edge region 240, a frontside center region 250 and a backside center region 255, as depicted in FIGS. 2A-2C and discussed above. The wafer chuck generally includes: (i) a central planar region positioned below the backside center region of the semiconductor substrate, and (ii) an edge support region positioned below the peripheral edge region of the semiconductor substrate.

The method 300 further includes activating the wafer chuck (in step 330) to clamp the backside center region of the semiconductor substrate onto the central planar region of the wafer chuck and elevate the peripheral edge region of the semiconductor substrate above the frontside center region of the semiconductor substrate. In the embodiment shown in FIG. 3, activating the wafer chuck (in step 330) applies an external force to the backside surface of the semiconductor substrate to reshape the frontside surface of the semiconductor substrate and ensure that the frontside surface is concave. The amount of reshaping provided in step 330 can vary depending on various factors, such as for example, the thickness of the semiconductor substrate, the material layers and structures formed on the frontside and/or backside surface of the substrate, the external force applied to the backside surface of substrate by the wafer chuck, etc. In some embodiments, the external force applied to the backside surface of the substrate in step 330 may reshape at least a portion of the frontside surface of the semiconductor substrate into a concave shape. For example, the frontside surface may be considered to be "concave" if at least the peripheral edge region of the semiconductor substrate is curved upward. In other embodiments, the external force applied to the backside surface of the substrate in step 330 may ensure that the frontside surface of the semiconductor substrate is planar or completely flat, rather than concave.

The method 300 further includes dispensing a first processing liquid onto the frontside surface of the semiconductor substrate after activating the wafer chuck to form a puddle of the first processing liquid that covers an entirety of the frontside surface (in step 340). By activating the wafer chuck (in step 330), the method 300 retains the puddle of the first processing liquid on the frontside surface by ensuring the frontside surface of the semiconductor substrate is concave (or completely flat). In some embodiments (not shown in FIG. 3), the wafer chuck may be deactivated after the puddle process is performed on the frontside surface of the semiconductor substrate (in step 340). For example, the wafer chuck may be deactivated to: (a) release or "unclamp" the semiconductor substrate from the wafer chuck, and/or (b) perform an additional process on the backside surface of the semiconductor substrate. In some embodiments, releasing or "unclamping" the semiconductor substrate may enable the frontside surface of the substrate to return to its previous shape or contour.

FIGS. 4A-4B and FIGS. 5A-5C illustrate various wafer chuck designs that utilize the method 300 shown in FIG. 3 to retain a puddle of processing liquid on a surface of a semiconductor substrate during a puddle process. The wafer chuck designs illustrated in FIGS. 4A-4B and FIGS. 5A-5C retain a puddle of processing liquid on a surface of a semiconductor substrate by temporarily reshaping the frontside surface of the semiconductor substrate to provide a frontside surface that is concave (or completely flat).

Figure 4A:
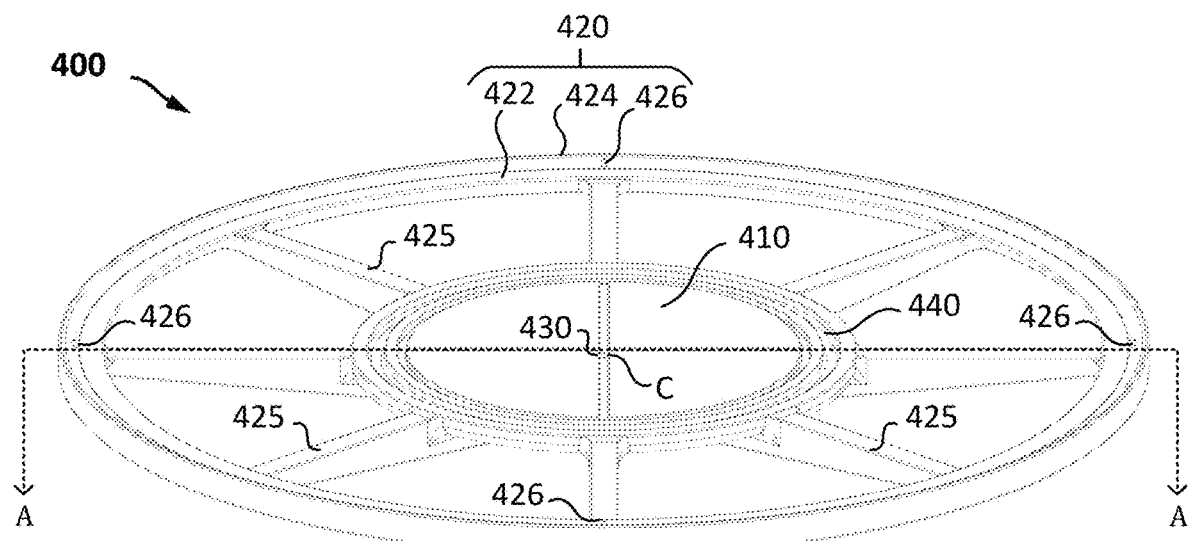
FIG. 4A is a three-dimensional (3D) perspective view of a wafer chuck in accordance with a first embodiment of the present disclosure.
Figure 4B:
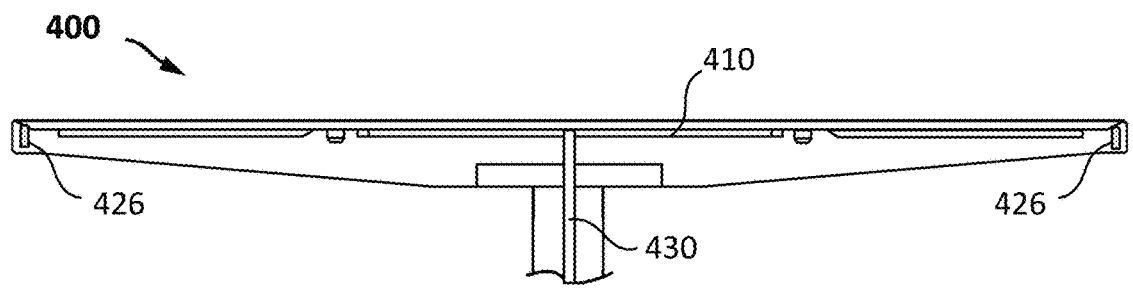
FIG. 4B is a side cross-sectional view through line A-A of FIG. 4A.

FIGS. 4A-4B illustrate a wafer chuck 400 in accordance with a first embodiment of the present disclosure. The wafer chuck 400 includes a central planar region 410 coupled to an edge support region 420 by a plurality of spokes 425. The plurality of spokes 425 are arranged at equidistant intervals around the central planar region 410, and are generally included within the wafer chuck design to reduce the weight of the wafer chuck 400. Although eight (8) spokes are depicted in FIG. 4A, wafer chuck 400 may include substantially any number of spokes that provide structural rigidity, while reducing the weight of the wafer chuck 400 (compared to a solid chuck of similar size).

The wafer chuck 400 further includes a fluid flow channel 430. As shown in FIGS. 4A-4B, the fluid flow channel 430 extends through the center (C) of the central planar region 410 for providing a fluid to, and/or removing a fluid from, the central planar region 410 and/or the backside surface 220 of a semiconductor substrate 200 supported by the wafer chuck 400. The fluid communicated through the fluid flow channel 430 may be a gas (e.g., air or an inert gas) or a liquid (e.g., deionized water or another processing liquid).

The diameter of the wafer chuck 400 is substantially equal to, or slightly larger than, the diameter of the semiconductor substrate to be processed. When the wafer chuck 400 is configured to support a 300 mm substrate, for example, the diameter of the wafer chuck 400 may range between about 305-315 mm. The edge support region 420 of the wafer chuck 400 comprises a fixed (i.e., immovable) annular support ring 422 for supporting the peripheral edge region 240 of the semiconductor substrate 200, a raised edge 424 for centering the semiconductor substrate 200 on the wafer chuck 400 and a plurality of wafer retention pins 426 for retaining the semiconductor substrate 200 mounted onto the wafer chuck 400. The diameter of the annular support ring 422 may be roughly equivalent to the diameter of the semiconductor substrate to be processed. The central planar region 410 of the wafer chuck 400 is smaller than, and arranged concentrically within, the edge support region 420. In some embodiments, the diameter of the central planar region 410 may be approximately 40-60% the diameter of the edge support region 420. In one example embodiment, the diameter of the annular support ring 422 may range between about 300-305 mm and the diameter of the central planar region 410 may range between about 140-180 mm when the wafer chuck 400 is configured to support a 300 mm substrate.

When a semiconductor substrate 200 is mounted onto the wafer chuck 400 (in step 320 of FIG. 3), the edge support region 420 of the wafer chuck 400 is positioned below for supporting the peripheral edge region 240 of the semiconductor substrate 200 and the central planar region 410 is positioned below the backside center region 255 of the semiconductor substrate 200. When the wafer chuck 400 is activated (in step 330 of FIG. 3), an external force is generated that pulls the backside center region 255 of the semiconductor substrate 200 down to hold or "clamp" the backside center region 255 onto the central planar region 410 of the wafer chuck 400 and reshape the frontside surface 210 of the semiconductor substrate 200. An O-ring (not shown) may be provided within an annular groove 440 formed near the periphery of the central planar region 410 to assist in sealing the backside center region 255 onto the central planar region 410 during activation of the wafer chuck 400. As described in more detail below, activation of the wafer chuck 400 may reshape the frontside surface 210 of the semiconductor substrate 200 to ensure that the frontside surface 210 is concave (or completely flat).

The wafer chuck 400 can be activated by applying a vacuum pressure or an electrostatic charge to the wafer chuck. In some embodiments, for example, the wafer chuck 400 can be activated by removing a gas from the backside surface 220 of the semiconductor substrate 200 (via the fluid flow channel 430) to generate the vacuum pressure needed to clamp the backside surface 220 of the semiconductor substrate 200 onto the central planar region 410 of the wafer chuck 400. In other embodiments, the wafer chuck 400 can be activated by providing a liquid to, and subsequently removing the liquid from, the backside surface 220 of the semiconductor substrate 200 (via the fluid flow channel 430) to generate the vacuum pressure needed to clamp the backside surface 220 of the semiconductor substrate 200 onto the central planar region 410 of the wafer chuck 400. Alternatively, the wafer chuck 400 may be activated by applying an electrostatic charge to the central planar region 410 when the wafer chuck 400 is an electrostatic chuck.

In the embodiment shown in FIGS. 4A-4B, the edge support region 420 of the wafer chuck 400 comprises a fixed (i.e., immovable) annular support ring 422 for supporting the peripheral edge region 240 of the semiconductor substrate 200. As shown in FIG. 4B, the annular support ring 422 is raised above an upper surface of the central planar region 410 by a fixed amount (e.g., about 0.2 mm to about 0.5 mm). When the wafer chuck 400 is activated to clamp the backside center region 255 onto the central planar region 410 of the wafer chuck (in step 330 of FIG. 3), the difference in height between the annular support ring 422 and the upper surface of the central planar region 410 enables the wafer chuck 400 to reshape the frontside surface 210 of the semiconductor substrate 200. The frontside surface 210 of the semiconductor substrate 200 can be reshaped to: (a) improve the planarity of a semiconductor substrate 200 that is bowed or warped by pulling the backside center region 255 of the semiconductor substrate 200 down onto the central planar region 410 of the wafer chuck 400, or (b) create a concave bow in the semiconductor substrate 200 by pulling the backside center region 255 of the semiconductor substrate 200 down onto the central planar region 410 and elevating the peripheral edge region 240 of the semiconductor substrate 200 above the frontside center region 250 of the semiconductor substrate 200.

In some embodiments, the wafer chuck 400 may be deactivated after the puddle process is performed on the frontside surface 210 of the semiconductor substrate 200 (in step 340 of FIG. 3) to release or "unclamp" the semiconductor substrate 200 from the wafer chuck 400 and/or to perform an additional process on the backside surface 220 of the semiconductor substrate 200. In the embodiment shown in FIGS. 4A-4B, the wafer chuck 400 may be deactivated by removing the vacuum pressure or electrostatic charge applied to the wafer chuck. Depending on the process performed on the frontside surface 210, "unclamping" the semiconductor substrate 200 may enable the frontside surface 210 of the substrate to return to its previous shape or contour.

Figure 5A:
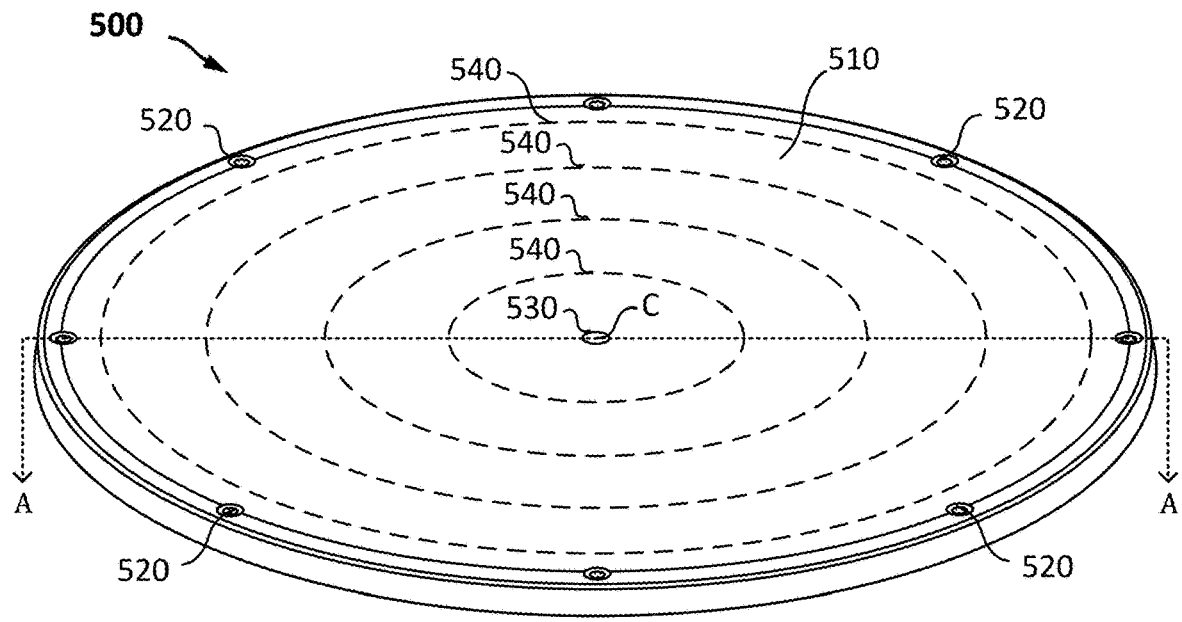
FIG. 5A is a 3D perspective view of a wafer chuck in accordance with a second embodiment of the present disclosure.
Figure 5C:
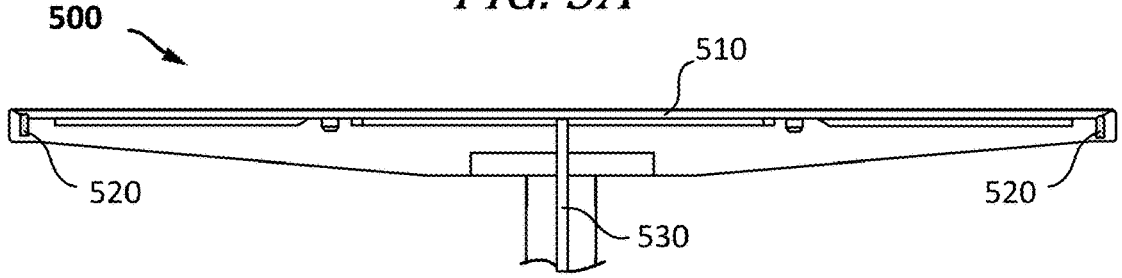
FIG. 5C is a side cross-sectional view through line A-A of FIG. 5A and FIG. 5B.
Figure 5B:
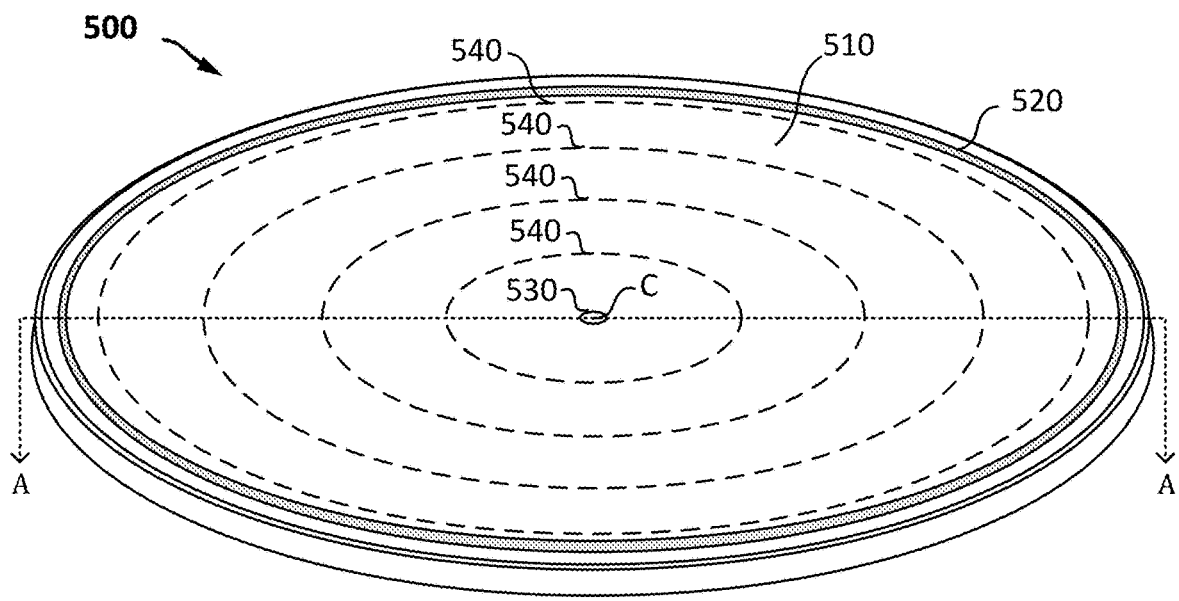
FIG. 5B is a 3D perspective view of a wafer chuck in accordance with a third embodiment of the present disclosure.

FIGS. 5A-5C illustrate a wafer chuck 500 in accordance with a second and third embodiment of the present disclosure. Like the previous embodiment shown in FIGS. 4A-4B, the wafer chuck 500 shown in FIGS. 5A-5C includes: (i) a central planar region 510 positioned below a backside center region 255 of a semiconductor substrate 200, (ii) an edge support region 520 positioned below the peripheral edge region 240 of the semiconductor substrate 200, and (iii) a fluid flow channel 530 that extends through the center (C) of the central planar region 510 for providing a fluid to, and/or removing a fluid from, the central planar region 510 of the wafer chuck and/or the backside surface 220 of the semiconductor substrate 200. The fluid communicated through the fluid flow channel 530 may be a gas or a liquid, as discussed above. Like the previous embodiment shown in FIGS. 4A-4B, the diameter of the wafer chuck 500 may be substantially equal to, or slightly larger than, the diameter of the semiconductor substrate to be processed. When configured to support a 300 mm substrate, for example, the diameter of the wafer chuck 500 may range between about 305-315 mm.

The embodiments shown in FIGS. 5A-5C differ from the previous embodiment in a variety of different ways. Unlike the spoke design shown in FIGS. 4A-4B, the diameter of the central planar region 510 on the wafer chuck 500 is roughly equivalent to the diameter of the semiconductor substrate to be processed. When a semiconductor substrate 200 is mounted onto the wafer chuck 500 (in step 320 of FIG. 3), the central planar region 510 provides a substantially flat surface for supporting the entire backside surface 220 of the semiconductor substrate.

In the embodiments shown in FIGS. 5A-5C, the edge support region 520 of the wafer chuck 500 is recessed below an upper surface of the central planar region 510 when the semiconductor substrate 200 is initially mounted onto the wafer chuck 500 (in step 320 of FIG. 3), and raised above the upper surface of the central planar region 510 when the wafer chuck 500 is activated (in step 330 of FIG. 3). The edge support region 520 includes a plurality of support pins in the embodiment shown in FIG. 5A, and an annular support ring in the embodiment shown in FIG. 5B.

When the wafer chuck 500 is activated (in step 330 of FIG. 3), the plurality of support pins (shown in FIG. 5A) or the annular support ring (shown in FIG. 5B) are mechanically lifted, while a vacuum pressure or electrostatic charge is applied to at least a portion of the wafer chuck 500 (e.g., an inner portion of the central planar region 510). The vacuum pressure or electrostatic charge applied to the wafer chuck 500 generates an external force, which pulls the backside center region 255 of the semiconductor substrate 200 down to hold or "clamp" the backside center region 255 onto the central planar region 510 of the wafer chuck 500. The plurality of support pins (shown in FIG. 5A) or the annular support ring (shown in FIG. 5B) generate an opposing force, which lifts the peripheral edge region 240 of the semiconductor substrate 200 to elevate the peripheral edge region 240 above the frontside center region 250 of the semiconductor substrate 200. In doing so, the wafer chuck 500 reshapes the frontside surface 210 of the semiconductor substrate 200 to ensure that the frontside surface 210 is concave (or completely flat).

In the embodiment shown in FIGS. 5A-5C, the edge support region 520 of the wafer chuck 500 comprises a plurality of pins or an annular support ring, which is/are mechanically lifted by an internal component of the wafer chuck 500 to elevate the peripheral edge region 240 of the semiconductor substrate 200. In some embodiments, the plurality of pins or annular support ring can be mechanically lifted above the upper surface of the central planar region 410 by a variable amount (e.g., by about 0.2 mm to about 0.5 mm). When the wafer chuck 500 is activated (in step 330 of FIG. 3), the difference in height between the mechanically lifted pins/annular support ring and the upper surface of the central planar region 510 enables the wafer chuck 500 to reshape the frontside surface 210 of the semiconductor substrate 200. The frontside surface 210 of the semiconductor substrate 200 can be reshaped to improve the planarity of the semiconductor substrate 200 or create a concave bow in the semiconductor substrate 200.

In some embodiments, the wafer chuck 500 may be deactivated after the puddle process is performed on the frontside surface 210 of the semiconductor substrate 200 (in step 340 of FIG. 3) to release or "unclamp" the semiconductor substrate 200 from the wafer chuck 500 and/or to perform an additional process on the backside surface 220 of the semiconductor substrate 200. In the embodiment shown in FIGS. 5A-5C, the wafer chuck 500 may be deactivated by: (a) removing a vacuum pressure or an electrostatic charge applied to the wafer chuck, and/or (b) lowering the plurality of pins/annular support ring below the upper surface of the central planar region 510. Depending on the process performed on the frontside surface 210, "unclamping" the semiconductor substrate 200 may enable the frontside surface 210 of the substrate to return to its previous shape or contour.

In some embodiments, the wafer chuck 500 may be heated to maintain a uniform substrate temperature and/or ensure that the temperature of the puddle formed on the frontside surface 210 of the semiconductor substrate 200 (in step 340 of FIG. 3) is uniform across the frontside surface 210 of the substrate. For example, the wafer chuck 500 may include a plurality of multi-zone annular heating elements 540, as shown in FIGS. 5A and 5B. The multi-zone annular heating elements 540 can be set to the same temperature, or may be individually adjusted, to control the temperature of the wafer chuck 500 and the substrate mounted thereon. When multi-zone annular heating elements 540 are provided, one or more heating elements near the periphery of the wafer chuck 500 may be set to a temperature, which is greater than or equal to the temperature of one or more heating elements near the center of the wafer chuck 500 to combat liquid cooling near the substrate edge and maintain a uniform puddle temperature across the substrate surface, thereby improving the performance of the puddle process across the substrate surface. Although multi-zone annular heating elements 540 are depicted in FIGS. 5A and 5B, other means for heating the wafer chuck 500 may also be used to maintain a uniform substrate/puddle temperature.

FIGS. 6A-6E illustrate one example of a process flow 600 that utilizes the techniques described herein to retain a puddle formed on a surface of a semiconductor substrate mounted onto a wafer chuck. Process flow 600 can be performed within a variety of wet processing chambers. In one embodiment, the process flow 600 can be performed within a spin chamber similar to that shown in FIG. 1A. It is recognized, however, that the process flow 600 may be performed within other wet processing chambers and systems, as is known in the art.

Figure 6A:
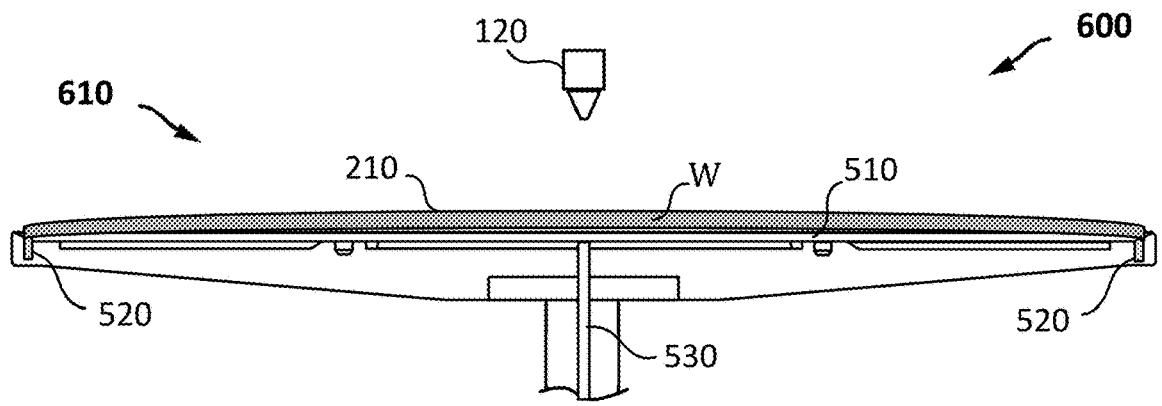
FIGS. 6A-6E are side cross-sectional views through line A-A of FIG. 5A or FIG. 5B, illustrating one example of a process flow that utilizes the techniques described herein to retain a puddle formed on a surface of a semiconductor substrate (W) mounted onto the wafer chuck.

The process flow 600 begins in step 610 of FIG. 6A by mounting a semiconductor substrate (or wafer, W) onto a wafer chuck. Although the wafer chuck 500 is depicted in FIGS. 6A-6E, the process flow 600 can be performed using the wafer chuck 400 shown in FIGS. 4A-4B or another wafer chuck having features similar to those shown and described herein.

The semiconductor substrate W mounted onto the wafer chuck 500 in step 610 includes a frontside surface 210, a backside surface 220, a peripheral edge region 240, a frontside center region 250 and a backside center region 255, as depicted in FIGS. 2A-2C and discussed above. In the process flow 600, the backside surface 220 of the semiconductor substrate W is mounted onto the wafer chuck 500 so that a puddle process can be performed on the frontside surface 210 of the semiconductor substrate W. However, puddle processes are not limited to the frontside surface 210 of the substrate W and may be alternatively performed on the backside surface 220 of the substrate W, in other embodiments.

As noted above, various process conditions (such as substrate bowing or warpage, the hydrophobicity of the substrate surface, varying edge conditions and chuck level) may adversely affect a puddle process performed on the frontside surface 210 of the semiconductor substrate W. For example, the frontside surface 210 of the semiconductor substrate W may be: (a) substantially planar (or flat) with beveled edges within the peripheral edge region 240, or (b) bowed or warped, as depicted for example in FIG. 6A. The beveled edges within the peripheral edge region 240 and/or the bowed or warped contour of the semiconductor substrate may inhibit full chemical coverage or induce spill over during a puddle process. To improve the puddle process performance, the process flow 600 activates the wafer chuck 500 in step 620 of FIG. 6B to reshape the frontside surface 210 of the semiconductor substrate W before dispensing a processing liquid (L) onto the frontside surface 210 of the substrate W to form a puddle on the frontside surface 210 in step 630 of FIG. 6C.

In some embodiments, the wafer chuck 500 may be activated in step 620 by: (a) applying a vacuum pressure to the wafer chuck 500 (via the fluid flow channel 530), and (b) mechanically lifting the edge support region 520 above the upper surface of the central planar region 510 of the wafer chuck 500, as described above in reference to FIGS. 5A-5C. In other embodiments, the wafer chuck 400 may be activated by applying a vacuum pressure or an electrostatic charge to the wafer chuck 400, as described above in reference to FIGS. 4A-4B.

Figure 6B:
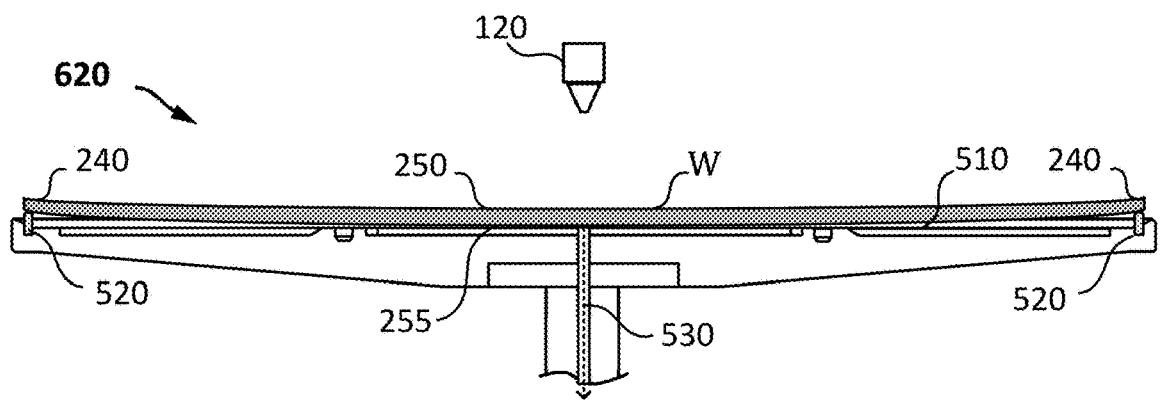

As shown in FIG. 6B, activating the wafer chuck 500 clamps the backside center region 255 of the semiconductor substrate W onto the central planar region 510 of the wafer chuck 500 and elevates the peripheral edge region 240 of the semiconductor substrate W above the frontside center region 250 of the substrate W to reshape the frontside surface 210 of the substrate W. In some embodiments, wafer chuck activation may reshape the frontside surface 210 of the semiconductor substrate W to improve the planarity of the frontside surface 210 and/or ensure that the beveled edges within the peripheral edge region 240 are flat and level. In other embodiments, wafer chuck activation may reshape the frontside surface 210 of the semiconductor substrate W to create a concave bow in the frontside surface 210, as shown in FIG. 6B.

Figure 6C:
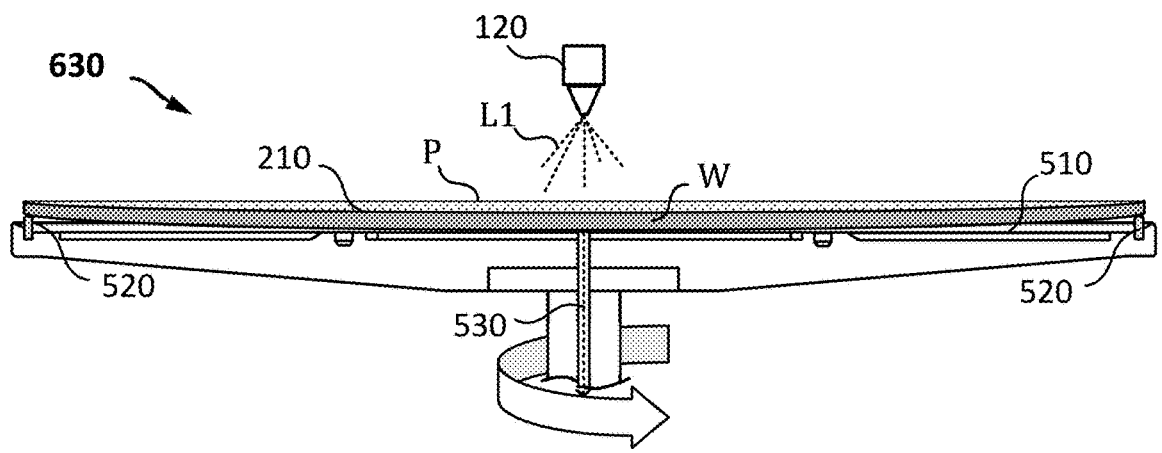

A puddle process is performed in step 630 of FIG. 6C to process the frontside surface 210 of the semiconductor substrate W after the wafer chuck 500 is activated in step 620 to reshape the frontside surface 210. In the puddle process shown in FIG. 6C, a first processing liquid (L1) is dispensed onto the frontside surface 210 of the semiconductor substrate W, while the wafer chuck 500 is stationary or spinning at a first rotational speed (ranging, for example, between 0 to 50 RPM), to form a puddle (P) of the first processing liquid on the frontside surface 210. Reshaping the frontside surface 210 in FIG. 6B enables the puddle process shown in FIG. 6C to form a puddle (P) that completely covers the frontside surface 210 (i.e., provides complete chemical coverage) without spilling over the edge of the semiconductor substrate W.

In some embodiments, the puddle (P) of the first processing liquid formed in step 630 of FIG. 6C may be dispersed across the frontside surface 210 of the semiconductor substrate W by spinning the wafer chuck 500 at the first rotational speed. In other embodiments, the puddle (P) of the first processing liquid may be dispersed across the frontside surface 210 of the semiconductor substrate W by tilting the wafer chuck 500 while spinning the wafer chuck 500 at the first rotational speed. In some embodiments, the wafer chuck 500 and/or the first processing liquid (L1) may be heated to ensure that the puddle (P) maintains a uniform temperature across the frontside surface 210 of the semiconductor substrate W during the puddle process.

In some embodiments, the process flow 600 may perform additional processing step(s) after the puddle process is performed in step 630 of FIG. 6C. For example, the process flow 600 may dispense a second processing liquid (L2) onto the frontside surface 210 of the semiconductor substrate W in step 640 of FIG. 6D while spinning the wafer chuck 500 at a second rotational speed, which is faster than the first rotational speed. The second rotational speed may range, for example, between about 200 to 3000 RPM. In some embodiments, the second processing liquid (L2) may be dispensed onto the frontside surface 210 of the semiconductor substrate W in step 640 to remove the first processing liquid (L1) from the frontside surface 210. In other embodiments, the second processing liquid (L2) may be dispensed onto the frontside surface 210 of the semiconductor substrate W in step 640 to perform other processing on the frontside surface 210, as is known in the art.

Figure 6D:
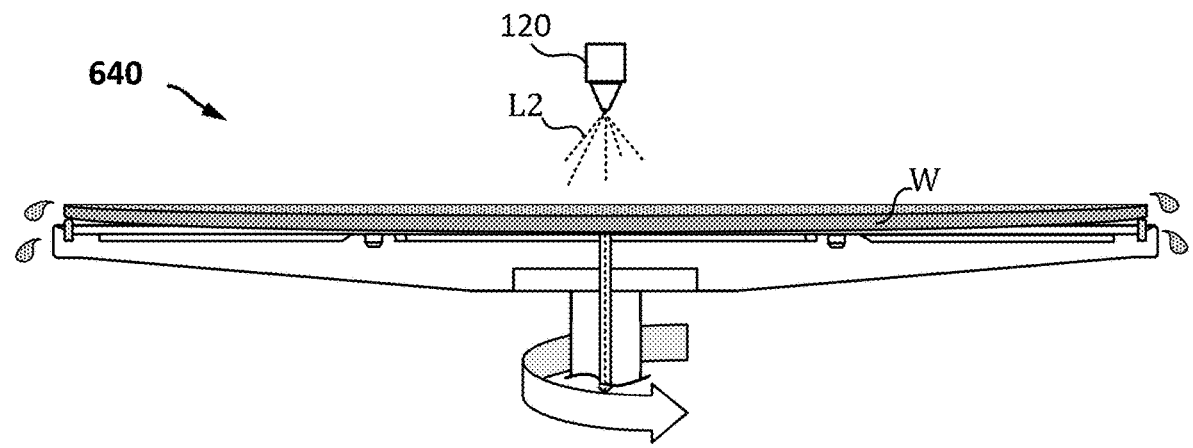
Figure 6E:
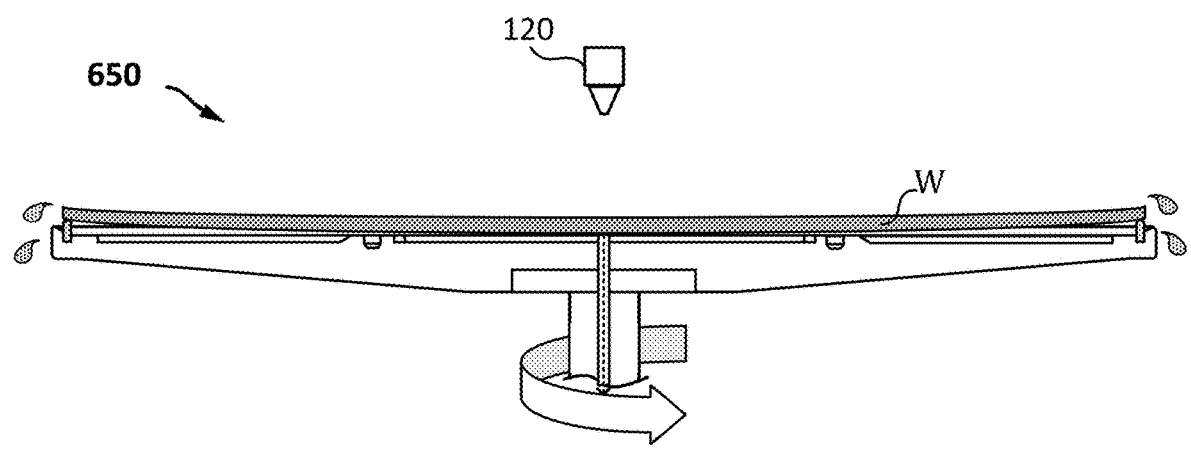

In some embodiments, the process flow 600 may continue spinning the wafer chuck 500 in step 650 of FIG. 6E to remove the processing liquid(s) dispensed onto the frontside surface 210 and spin-dry the semiconductor substrate W. For example, the process flow 600 may continue spinning the wafer chuck 500 at a rotational speed, which is greater than or equal to the second rotational speed in step 650 to spin-dry the semiconductor substrate W.

In some embodiments, the process flow 600 may deactivate the wafer chuck 500 before or after spin-drying the semiconductor substrate W in step 650. For example, the wafer chuck 500 may be deactivated to release or "unclamp" the semiconductor substrate W from the wafer chuck 500 and/or to perform an additional process on the backside surface of the semiconductor substrate (as shown, e.g., in FIGS. 7A-7C). In some embodiments, the wafer chuck 500 may be deactivated by: (a) removing the vacuum pressure applied to the wafer chuck 500 (via the fluid flow channel 530), and/or (b) lowering the edge support region 520 below the upper surface of the central planar region 510 of the wafer chuck 500 to release the peripheral edge region 240 of the semiconductor substrate W, as described above in reference to FIGS. 5A-5C. In other embodiments, the wafer chuck 400 may be deactivated by removing a vacuum pressure or an electrostatic charge previously to the wafer chuck 400, as described above in reference to FIGS. 4A-4B. In some embodiments, deactivating the wafer chuck may enable the frontside surface 210 of the semiconductor substrate W to return to its previous shape or contour.

A wide variety of processing liquids may be dispensed onto the frontside surface 210 of the semiconductor substrate W in step 630 of FIG. 6C and step 640 of FIG. 6D, depending on the process(es) being performed on the frontside surface 210. When performing a cleaning process, for example, a cleaning solution may be dispensed onto the frontside surface 210 of the semiconductor substrate W in step 630 and a rinsing solution and/or a drying solution may be dispensed onto the frontside surface 210 in step 640. When performing an etching process, an etching solution may be dispensed onto the frontside surface 210 of the semiconductor substrate W in step 630, followed by a rinsing and/or drying solution in step 640. In yet another example, a coating material (e.g., a photoresist) and/or a developer solvent may be dispensed onto the frontside surface 210 of the semiconductor substrate W when performing a photoresist patterning process. Other processing liquids may be dispensed onto the frontside surface 210 of the semiconductor substrate W when performing other processes, as is known in the art.

In one example embodiment, a cleaning solution may be dispensed onto the frontside surface 210 of the semiconductor substrate W in step 630 of FIG. 6C to clean and/or remove contaminants from the frontside surface 210 of the substrate. A wide variety of cleaning solutions may be dispensed in step 630. For example, a variety of standard clean 1 (SC1) and standard clean 2 (SC2) solvents may be dispensed in step 630, including an ammonia/peroxide mixture (APM), a hydrochloric/peroxide mixture (HPM) and/or a sulfuric peroxide mixture (SPM). Other cleaning solutions may also be utilized in step 630, as is known in the art. The cleaning solution may be dispensed in step 630, while the wafer chuck 500 is stationary or spinning at a first rotational speed (e.g., 0 to 50 RPM), to form a puddle of the cleaning solution on the frontside surface 210. The puddle of cleaning solution may remain on the frontside surface 210 for a period of time (e.g., seconds to minutes) needed to clean the frontside surface 210. By utilizing a puddle process as shown in FIG. 6C and described above, the process flow 600 may improve the cleaning performance and reduce the amount of cleaning solution (e.g., up to about 83%) used to clean the frontside surface 210 of the semiconductor substrate W compared to conventional spin-on cleaning techniques.

After a cleaning puddle process is performed in step 630 of FIG. 6C, the process flow 600 may dispense one or more additional solutions onto the frontside surface 210 of the semiconductor substrate W, while the wafer chuck 500 is spinning in the step 640 of FIG. 6D. For example, a variety of rinse solutions may be used in step 640 to rinse the semiconductor substrate W and/or remove the cleaning solution from the frontside surface 210 of the substrate. In some embodiments, deionized water or isopropyl alcohol (IPA) may be used as the rinse solution. As the semiconductor substrate W spins, the cleaning solution and the rinse solution dispensed onto the frontside surface 210 of the semiconductor substrate W are expelled from the frontside surface 210, captured by the cup and discharged through the drain lines (see, e.g., FIG. 1A). After the frontside surface 210 of the semiconductor substrate W is rinsed in step 640, the process flow 600 may dispense a drying solution (e.g., IPA) onto the frontside surface 210 in step 640 and/or continue to spin the semiconductor substrate W to dry the semiconductor substrate W in a spin dry step, as shown of FIG. 6E.

At least one liquid nozzle 120 may be used to dispense the processing liquids onto the frontside surface 210 of the semiconductor substrate W in FIGS. 6C and 6D. In the illustrated embodiment, the at least one liquid nozzle 120 is depicted as a single nozzle, which is positioned above the center of the wafer chuck 500 for dispensing a processing liquid onto a surface (e.g., the frontside surface 210) of the semiconductor substrate W mounted onto the wafer chuck 500. The single nozzle may be fixed above the center of the wafer chuck 500 for dispensing the processing liquid(s) onto the center of the substrate, or may be translatable across the substrate surface for dispensing the processing liquid(s) across multiple locations. Alternatively, the at least one liquid nozzle 120 may include a plurality of liquid nozzles, or a spray bar or shower head having multiple liquid injection ports, for dispensing the processing liquid(s) at multiple different locations across the substrate surface.

In some embodiments, the at least one liquid nozzle 120 may be positioned substantially perpendicular to the substrate surface, as shown in FIGS. 6A-6E. In other embodiments, the at least one liquid nozzle 120 may be angled (relative to the substrate surface) to minimize splashing of the processing liquid(s) dispensed onto the substrate surface. In some embodiments, the at least one liquid nozzle 120 may have an oblong nozzle opening designed to create a flattened fan dispense, which provides faster coverage of the semiconductor surface.

In some embodiments, at least one heating element (not shown) may be coupled to the at least one liquid nozzle 120 for heating the processing liquid(s) dispensed onto the substrate surface. When the at least one liquid nozzle 120 is configured as a spray bar or shower head with multiple liquid injection ports, multiple heating elements may be provided on the top, the bottom or both the top and bottom of the at least one liquid nozzle 120 for heating the processing liquid(s) before the processing liquid(s) are dispensed onto the substrate surface.

Figure 7A:
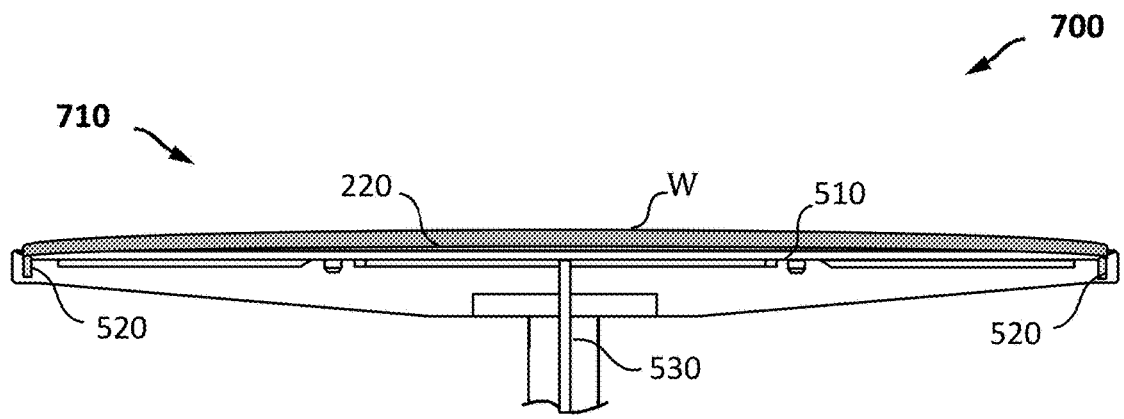
FIGS. 7A-7C are side cross-sectional views through line A-A of FIG. 5A or FIG. 5B, illustrating exemplary process flows that utilize the techniques described herein to: (a) clamp a semiconductor substrate (W) onto the wafer chuck using a fluid vacuum pressure, or (b) process a backside surface of a semiconductor substrate (W) mounted onto the wafer chuck.
Figure 7B:
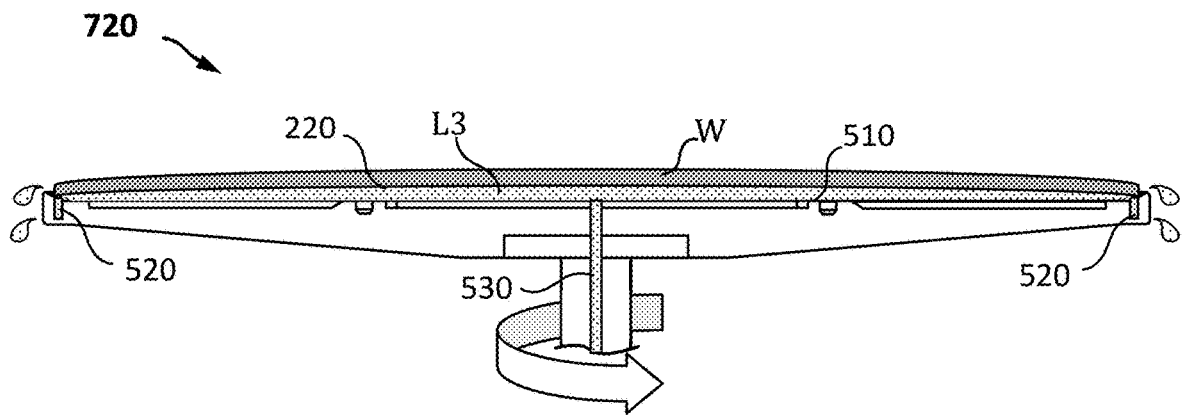
Figure 7C:
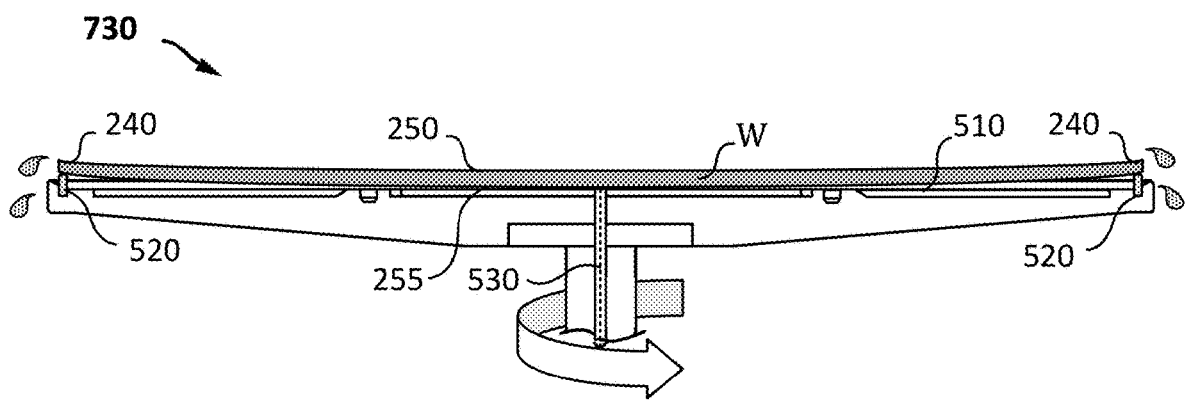

FIGS. 7A-7C illustrate additional examples of a process flow 700 that utilizes the techniques described herein. The process flow 700 may be performed before, during or after the process flow 600 in the same wet processing chamber. Although the wafer chuck 500 is depicted in FIGS. 7A-7C, the process flow 700 can also be performed using the wafer chuck 400 shown in FIGS. 4A-4B or another wafer chuck design having features similar to those shown and described herein.

According to one embodiment, the process flow 700 may be performed before the process flow 600 to clamp a semiconductor substrate onto a wafer chuck using a fluid vacuum pressure. In such an embodiment, the process flow 700 may begin by mounting a semiconductor substrate (or wafer, W) onto a wafer chuck in step 710 of FIG. 7A. The semiconductor substrate W mounted onto the wafer chuck 500 may generally include a frontside surface 210, a backside surface 220, a peripheral edge region 240, a frontside center region 250 and a backside center region 255, as depicted in FIGS. 2A-2C and discussed above. In the embodiment shown in FIG. 7A, the backside surface 220 of the semiconductor substrate W is mounted onto the wafer chuck 500 with the frontside surface 210 facing up.

After mounting the semiconductor substrate W onto the wafer chuck 500, the process flow 700 activates the wafer chuck 500 generating a fluid vacuum pressure below the backside surface 220 of the semiconductor substrate W. The fluid vacuum pressure is generated by providing a processing liquid (L3) to the backside surface 220 of the semiconductor substrate W in step 720 of FIG. 7B, and subsequently removing (or sucking back) the processing liquid (L3) in step 730 of FIG. 7C. The processing liquid (L3) may be provided to, and removed from, the backside surface 220 via the fluid flow channel 530 while the wafer chuck 500 is stationary or spinning at a predetermined rotational speed. When the processing liquid (L3) is removed in step 730 of FIG. 7C, a fluid vacuum pressure is generated to clamp the backside center region 255 of the semiconductor substrate W onto the central planar region 510 of the wafer chuck 500. A wide variety of processing liquids may be provided to, and removed from, the backside surface 220 of the semiconductor substrate W in step 720 to generate a fluid vacuum pressure. In one example, deionized water (or another processing liquid) may be used in step 720 to generate a fluid vacuum pressure.

In some embodiments, the process flow 700 may further activate the wafer chuck 500 by mechanically lifting the edge support region 520 of the wafer chuck 500 above the upper surface of the central planar region 510 of the wafer chuck 500. In doing so, the wafer chuck 500 may elevate the peripheral edge region 240 of the semiconductor substrate W above the frontside center region 250 of the semiconductor substrate W to reshape the frontside surface 210 of the substrate, as described above in reference to FIGS. 5A-5C and shown in FIG. 7C.

According to another embodiment, the process flow 700 may be performed during or after the process flow 600 to process a backside surface of a semiconductor substrate (W) mounted onto the wafer chuck. In such an embodiment, the process flow 700 may begin by deactivating the wafer chuck 500 to unclamp the semiconductor substrate W in step 710 of FIG. 7A. In some embodiments, the process flow 700 may deactivate the wafer chuck 500 in step 710 by: (a) removing the vacuum pressure applied to the wafer chuck 500 (via the fluid flow channel 530), and/or (b) lowering the edge support region 520 below the upper surface of the central planar region 510 of the wafer chuck 500 to release the peripheral edge region 240 of the semiconductor substrate W, as described above in reference to FIGS. 5A-5C and shown in FIG. 7A. In other embodiments, the wafer chuck 400 may be deactivated by removing a vacuum pressure or an electrostatic charge previously to the wafer chuck 400, as described above in reference to FIGS. 4A-4B.

After deactivating the wafer chuck 500 in step 710, the process flow 700 may dispense a processing liquid (L3) onto the backside surface 220 of the semiconductor substrate W in step 720 of FIG. 7B to process the backside surface 220. The processing liquid (L3) may be dispensed onto the backside surface 220 via the fluid flow channel 530 while the wafer chuck 500 is stationary or spinning at a predetermined rotational speed. A wide variety of processing liquids may be dispensed in step 720, depending on the process being performed on the backside surface 220. In some embodiments, a cleaning solution may be dispensed in step 720 to clean the backside surface 220 of the semiconductor substrate W and/or remove contaminants from the backside surface 220.

In some embodiments, contaminants may be deposited onto the backside surface 220 during a previous process performed on the frontside surface 210 of the semiconductor substrate W such as, but not limited to, the process flow 600 shown and described in reference to FIGS. 6A-6E. The contaminants deposited onto the backside surface 220, as a result of the frontside processing, can be removed by dispensing a cleaning solution onto the backside surface 220 in step 720 of FIG. 7B. The backside surface cleaning step (step 720 of FIG. 7B) can be performed during the frontside cleaning step (step 630 of FIG. 6C), during the frontside rinsing step (step 640 of FIG. 6D) or after the frontside rinsing step. In some embodiments, the backside surface cleaning step can be performed during the frontside cleaning or rinse steps to prevent cleaning fluids from wrapping around to the top the semiconductor substrate W.

After completing the process on the backside surface 220 in step 720 of FIG. 7B, the process flow 700 may perform a spin-dry step in step 730 of FIG. 7C to spin-dry the semiconductor substrate W. The spin-dry step may be performed in step 730 to remove the processing liquid (L3) from the backside surface 220 and spin-dry the semiconductor substrate W.

In some embodiments, the support pins within the edge support region 520 may retain the substrate W during the spin-dry step, allowing the process flow 700 to spin-dry the semiconductor substrate W in step 730 without activating the wafer chuck 500. In other embodiments, the process flow 700 may activate the wafer chuck 500 to re-clamp the semiconductor substrate W onto the wafer chuck 500 before performing the spin-dry step in step 730. The wafer chuck 500 can be activated by: (a) applying a vacuum pressure to the wafer chuck 500 (via the fluid flow channel 530), and/or (b) mechanically lifting the edge support region 520 above the upper surface of the central planar region 510 of the wafer chuck 500 to elevate the peripheral edge region 240 of the semiconductor substrate W, as described above in reference to FIGS. 5A-5C and shown in FIG. 7C. The vacuum pressure can be applied to the wafer chuck 500 by removing a gas (e.g., air or another inert gas) or a liquid (e.g., deionized water or another processing liquid) from the backside surface 220 of the semiconductor substrate W, as described above. In other embodiments, the wafer chuck 400 can be activated by applying a vacuum pressure or an electrostatic charge to the wafer chuck 400, as described above in reference to FIGS. 4A-4B.

Figure 8A:
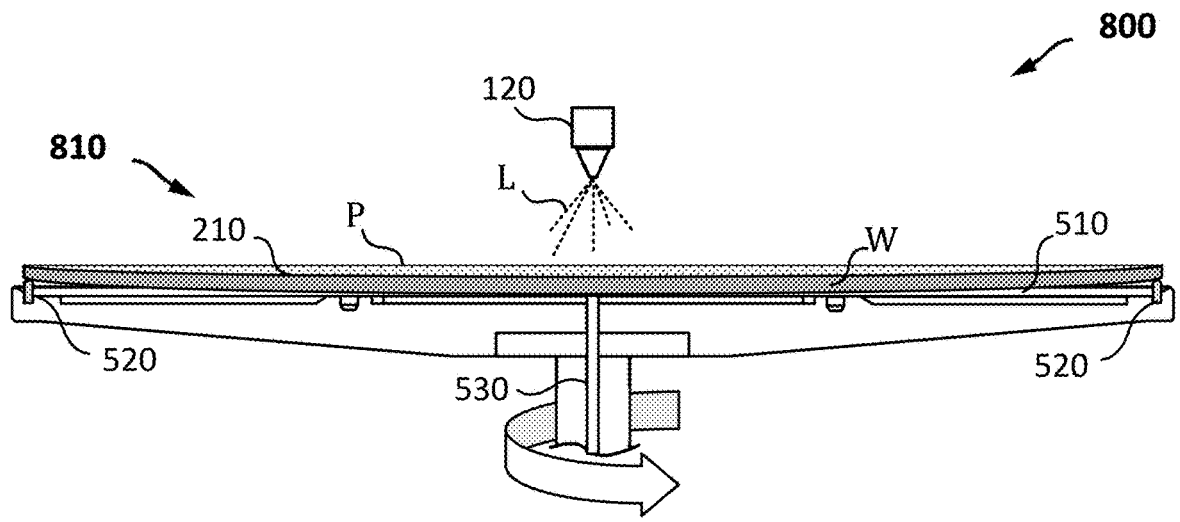
FIGS. 8A-8C are side cross-sectional views through line A-A of FIG. 5A or FIG. 5B, illustrating one example of a process flow that utilizes the techniques described herein to retain a puddle formed on a surface of a semiconductor substrate (W) while transferring the semiconductor substrate from a first processing chamber to a second processing chamber.
Figure 8B:
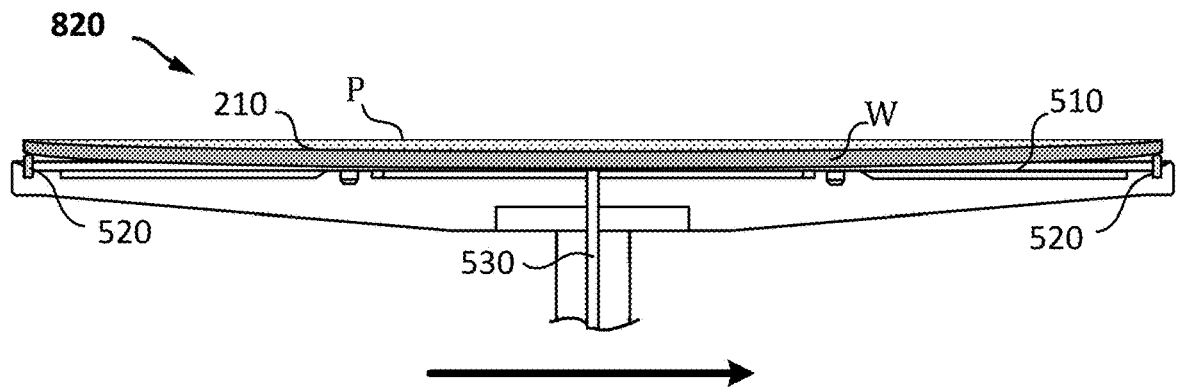
Figure 8C:
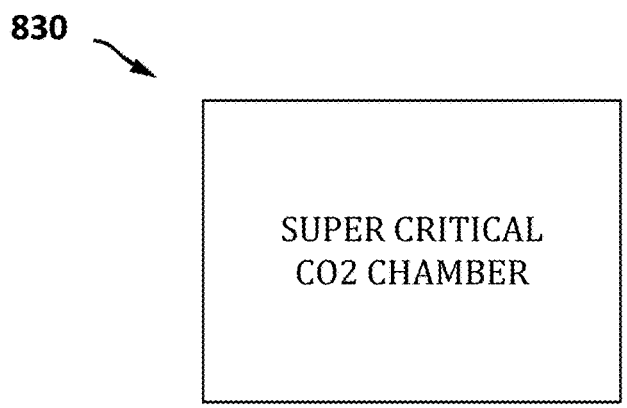

FIGS. 8A-8C illustrate another example of a process flow 800 that utilizes the techniques described herein to retain a puddle formed on a surface of a semiconductor substrate) mounted onto a wafer chuck. In the process flow 800, the puddle is retained on the surface of the semiconductor substrate while semiconductor substrate is transferred from a first processing chamber to a second processing chamber. In one embodiment, the first processing chamber may be a spin chamber used to form the puddle on the surface of the semiconductor substrate and the second processing chamber may be a supercritical processing chamber used to treat and/or dry the surface of the semiconductor substrate. Although a supercritical processing chamber is depicted in process flow 800, the techniques described herein can be used to retain a puddle on a surface of a semiconductor substrate while transferring the substrate to other types of processing chambers.

Process flow 800 begins in step 810 of FIG. 8A by performing a puddle process on a surface of a semiconductor substrate (or wafer, W), which is mounted onto a wafer chuck disposed within a first processing chamber (e.g., a spin chamber). Although the wafer chuck 500 is depicted in FIGS. 8A-8C, the process flow 800 can be performed using the wafer chuck 400 shown in FIGS. 4A-4B or another wafer chuck having features similar to those shown and described herein.

The semiconductor substrate W mounted onto the wafer chuck 500 includes a frontside surface 210, a backside surface 220, a peripheral edge region 240, a frontside center region 250 and a backside center region 255, as depicted in FIGS. 2A-2C and discussed above. In the process flow 800, the puddle process performed in step 810 is performed on the frontside surface 210 of the semiconductor substrate W. However, the puddle process is not limited to the frontside surface 210 and may be alternatively performed on the backside surface 220 of the substrate W, in other embodiments.

To perform the puddle process shown in FIG. 8A, the backside surface 220 of the semiconductor substrate W is mounted onto the wafer chuck 500 and the wafer chuck 500 is activated to reshape the frontside surface 210 of the semiconductor substrate before a processing liquid (L) is dispensed onto the frontside surface 210 to form a puddle (P) of the processing liquid on the frontside surface 210. The processing liquid (L) can be dispensed onto the frontside surface 210 from at least one liquid nozzle 120, as discussed above in reference to FIG. 6C. A wide variety of processing liquids can be dispensed onto the frontside surface 210 to form the puddle. In the example shown in FIG. 8A, a drying solution (such as IPA) is dispensed onto the frontside surface 210 of the semiconductor substrate W to form a puddle of the drying solution on the frontside surface 210 in step 810.

In the process flow 800, the semiconductor substrate W is transferred from the first processing chamber in step 820 of FIG. 8B to a supercritical processing chamber in step 830 of FIG. 8C after the drying solution is dispensed onto the frontside surface 210 of the semiconductor substrate W to form the puddle of drying solution on the frontside surface 210 in step 810 of FIG. 8A. Once transferred to the supercritical processing chamber, process flow 800 may treat a surface of the semiconductor substrate W with supercritical carbon dioxide ($CO_2$) before drying the surface of the semiconductor substrate.

In the process flow 800, the wafer chuck 500 is activated to reshape the frontside surface 210 of the semiconductor wafer W into a concave (or completely flat) shape before the processing liquid (L) is dispensed onto the frontside surface 210 of the semiconductor substrate W to form a puddle (P) of the processing liquid on the frontside surface 210. In some embodiments, the wafer chuck 500 can be activated by applying an electrostatic charge to the wafer chuck 500 and mechanically lifting the edge support region 520 above the upper surface of the central planar region 510 of the wafer chuck 500 to elevate the peripheral edge region of the semiconductor substrate W, as described above in reference to FIGS. 5A-5C and shown in FIG. 8A.

Activating the wafer chuck 500 reshapes the frontside surface 210 of the semiconductor substrate W to improve the planarity of the frontside surface 210 or create a concave bow in the frontside surface 210, as shown in FIG. 8A. Reshaping the frontside surface 210 of the semiconductor substrate W enables the process flow 800 to form a puddle in step 810 of FIG. 8A that completely covers the frontside surface 210 (i.e., provide complete chemical coverage) without spilling over the edge of the substrate. When the process flow 800 transfers the semiconductor substrate W from the first processing chamber (e.g., a spin chamber) to the second processing chamber (e.g., a supercritical processing chamber) in step 820 of FIG. 8B, the wafer chuck 500 remains activated to hold the shape of the frontside surface 210 and retain the puddle on the frontside surface 210 of the semiconductor substrate W. In some embodiments, an electrostatic chuck may be used to maintain wafer chuck activation while transferring the substrate W from one processing chamber to another in step 820 of FIG. 8B.

In the process flow 800, the puddle is retained on the substrate surface not only during the puddle process shown in FIG. 8A, but also during the wafer transfer process shown in FIG. 8B. This enhances the performance of the puddle process and the supercritical $CO_2$ drying process and represents a distinct advantage over conventional puddle processes.

The various embodiments of methods and process flows described above retain a puddle of processing liquid on a surface of a semiconductor substrate by reshaping the substrate surface into a concave (or completely flat) shape prior to dispensing the processing liquid onto the substrate surface. In the method and process flows described above, the wafer chucks 400/500 shown in FIGS. 4-5 (or similar wafer chuck designs) are used to reshape the substrate surface to retain a puddle of processing liquid on the substrate surface during a puddle process and/or while transferring the semiconductor substrate from one processing chamber to another.

Figure 9A:
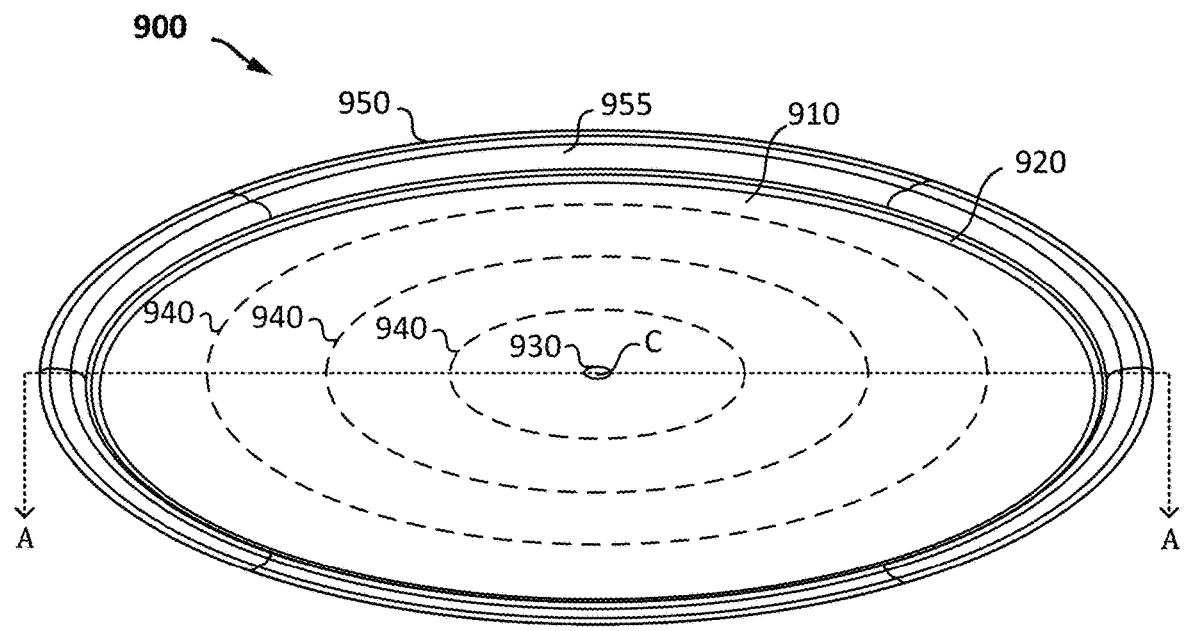
FIG. 9A is a 3D perspective view of a wafer chuck in accordance with a fourth embodiment of the present disclosure.
Figure 9B:
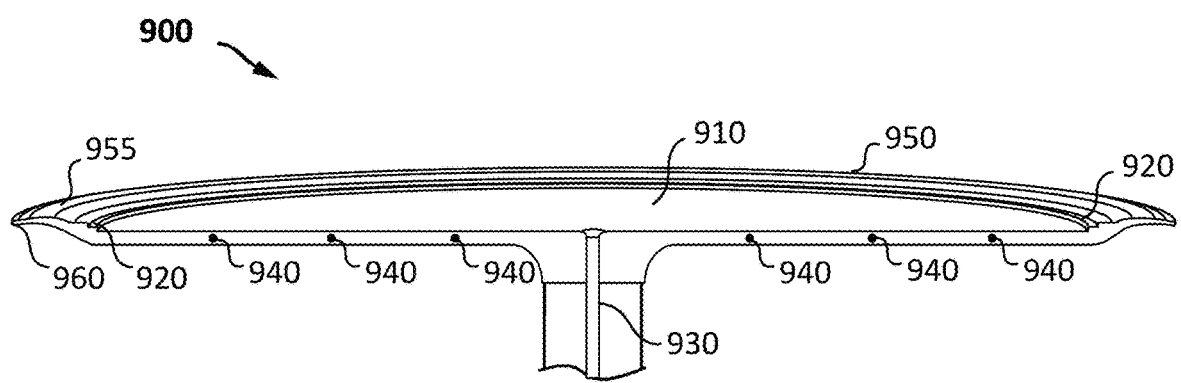
FIG. 9B is a side cross-sectional view through line A-A of FIG. 9A.

FIGS. 9A-9B illustrate a wafer chuck 900 in accordance with a fourth embodiment of the present disclosure. Like the wafer chucks 400/500 shown in FIGS. 4-5, the wafer chuck 900 shown in FIGS. 9A-9C includes a central planar region 910, an edge support region 920 and a fluid flow channel 930 that extends through the center (C) of the central planar region 910 for providing a fluid to, and/or removing a fluid from, the central planar region 910. The fluid communicated through the fluid flow channel 930 may be a gas or a liquid, as discussed above.

When a semiconductor substrate W is mounted onto the wafer chuck 900 with the frontside surface 210 facing up (as shown, e.g., in FIG. 10A), the edge support region 920 of the wafer chuck 900 is positioned below for supporting the peripheral edge region 240 of the semiconductor substrate W and the central planar region 910 of the wafer chuck 900 is positioned below the backside center region 255 of the semiconductor substrate W. Activating the wafer chuck 900 generates an external force to hold or "clamp" the peripheral edge region 240 of the semiconductor substrate W onto the edge support region 920 of the wafer chuck 900. The wafer chuck 900 can be activated by applying a vacuum pressure (e.g., a gas or liquid vacuum pressure) or an electrostatic charge to the wafer chuck.

The wafer chuck 900 differs from the wafer chucks 400/500 shown in FIGS. 4-5 in a variety of different ways. Unlike the previously disclosed embodiments, the wafer chuck 900 does not retain a puddle of processing liquid on a surface of a semiconductor substrate by reshaping the substrate surface. Instead, the wafer chuck 900 forms a shallow bowl having a raised lip 950 for containing the puddle on the substrate surface. Due to the raised lip 950, the wafer chuck 900 is slightly larger than the wafer chucks 400/500 and the diameter of the semiconductor substrate to be processed. When configured to support a 300 mm substrate, for example, the diameter of the wafer chuck 900 may range between about 310-320 mm.

As shown in FIGS. 9A-9B, the raised lip 950 extends from the edge support region 920 to a peripheral edge 960 of the wafer chuck 900, and has a convex upper surface 955 that is elevated above the edge support region 920 of the wafer chuck 900. When a processing liquid (L1) is dispensed onto a surface (e.g., the frontside surface 210) of the semiconductor substrate W to form a puddle (P) of the processing liquid on the substrate surface (as shown, e.g., in FIG. 10B), the raised lip 950 of the wafer chuck 900 forms a physical barrier that contains the puddle on the substrate surface. In some embodiments, the convex upper surface 955 of the raised lip 950 may be formed (or coated with) a hydrophobic material that repels liquid away from the raised lip 950 to further improve puddle containment. In some embodiments, the hydrophobic material provided on the convex upper surface 955 may enable the depth of the shallow bowl to be decreased to reduce splashing around the perimeter.

In some embodiments, the wafer chuck 900 may be heated to maintain a uniform substrate temperature and/or ensure that the temperature of the puddle formed on the surface of the semiconductor substrate is uniform across the substrate surface. For example, the wafer chuck 900 may include a plurality of multi-zone annular heating elements 940, as shown in FIGS. 9A and 9B. The multi-zone annular heating elements 940 can be set to the same temperature, or may be individually adjusted, to control the temperature of the wafer chuck 900 and the substrate mounted thereon. When multi-zone annular heating elements 940 are provided, one or more heating elements near the periphery of the wafer chuck 900 may be set to a temperature, which is greater than or equal to the temperature of one or more heating elements near the center of the wafer chuck 900 to combat liquid cooling near the substrate edge and maintain a uniform puddle temperature across the substrate surface, thereby improving the performance of the puddle process across the substrate surface. Although multi-zone annular heating elements 940 are depicted in FIGS. 9A and 9B, other means for heating the wafer chuck 900 may also be used to maintain a uniform substrate/puddle temperature.

Figure 10A:
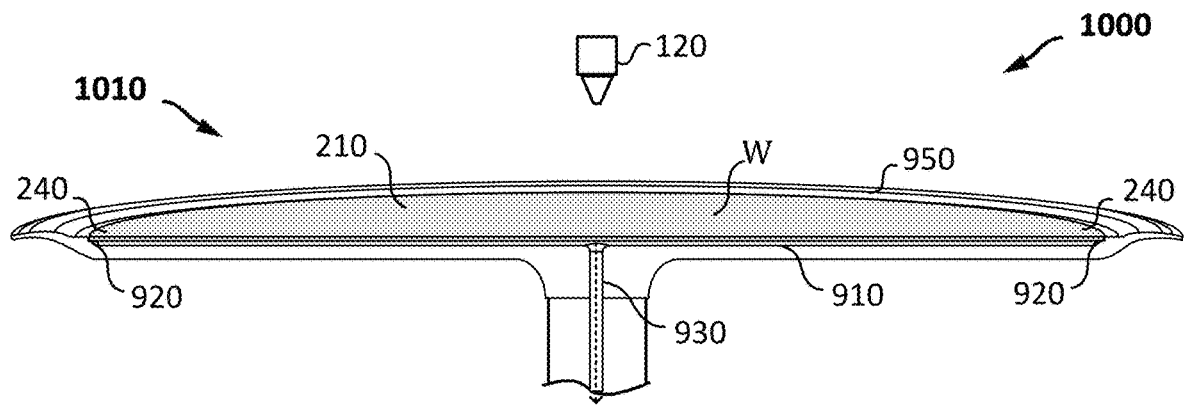
FIGS. 10A-10C are side cross-sectional views through line A-A of FIG. 9A, illustrating one example of a process flow that utilizes the techniques described herein to process a frontside surface and a backside surface of a semiconductor substrate (W) mounted onto the wafer chuck.
Figure 10B:
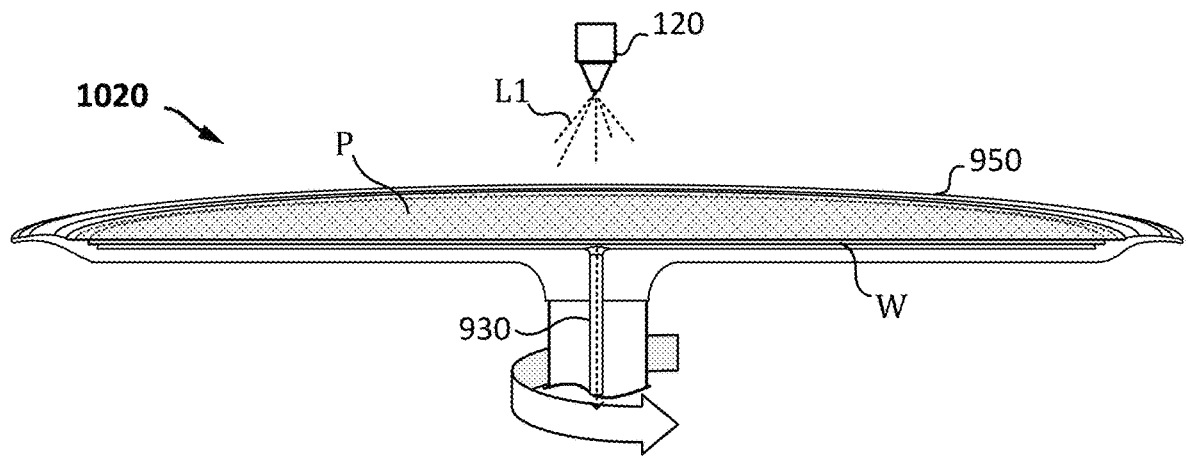
Figure 10C:
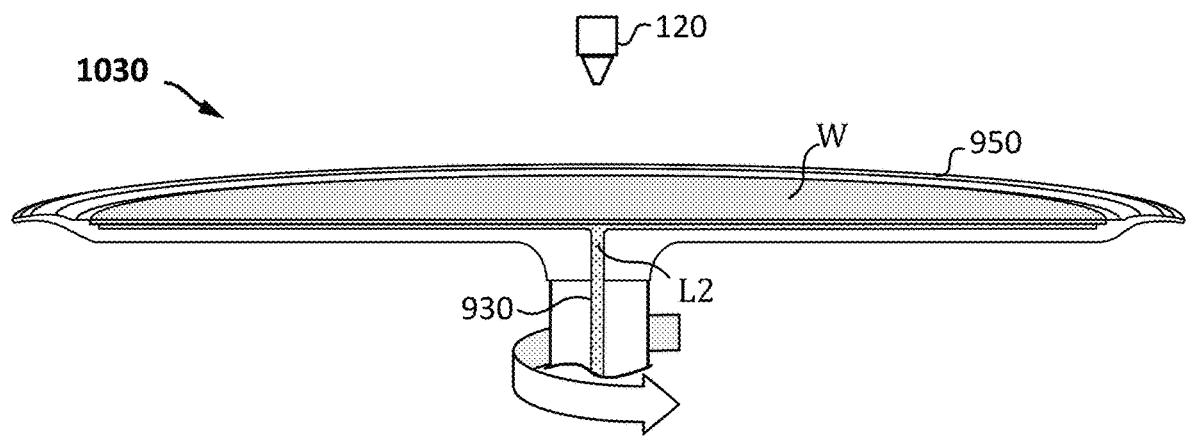

FIGS. 10A-10C illustrate one example of a process flow 1000 that utilizes the techniques described herein to retain a puddle formed on a surface of a semiconductor substrate mounted onto the wafer chuck 900. Process flow 1000 can be performed within a variety of wet processing chambers. In one embodiment, the process flow 1000 can be performed within a spin chamber similar to that shown in FIG. 1A. It is recognized, however, that the process flow 1000 may be performed within other wet processing chambers and systems, as is known in the art.

The process flow 1000 begins in step 1010 of FIG. 10A by mounting a semiconductor substrate (or wafer, W) onto the wafer chuck 900 and activating the wafer chuck 900 to hold or "clamp" the semiconductor substrate W onto the wafer chuck 900. The semiconductor substrate W mounted onto the wafer chuck 900 in step 1010 includes a frontside surface 210, a backside surface 220, a peripheral edge region 240, a frontside center region 250 and a backside center region 255, as depicted in FIGS. 2A-2C and discussed above. In the process flow 1000, the backside surface 220 of the semiconductor substrate W is mounted onto the wafer chuck 900 so that a puddle process can be performed on the frontside surface 210 of the semiconductor substrate W (in step 1020 of FIG. 10B). However, the puddle process is not limited to the frontside surface 210 and may alternatively be performed on the backside surface 220 of the substrate W, in other embodiments.

As noted above, the wafer chuck 900 can be activated by applying a vacuum pressure (e.g., a gas or liquid vacuum pressure) or an electrostatic charge to the wafer chuck. As shown in FIG. 10A, activating the wafer chuck 900 clamps the peripheral edge region 240 of the semiconductor substrate W onto the edge support region 920 of the wafer chuck 900. Unlike the previous embodiments, activating the wafer chuck 900 does not significantly reshape the semiconductor substrate W mounted thereon.

A puddle process is performed in step 1020 of FIG. 10B to process the frontside surface 210 of the semiconductor substrate W after the wafer chuck 900 is activated in step 1010. In the puddle process shown in FIG. 10B, a first processing liquid (L1) is dispensed onto the frontside surface 210 of the semiconductor substrate W, while the wafer chuck 900 is stationary or spinning at a first rotational speed (ranging, for example, between 0 to 50 RPM), to form a puddle (P) of the first processing liquid on the frontside surface 210. The first processing liquid (L1) can be dispensed onto the frontside surface 210 from at least one liquid nozzle 120, as discussed above in reference to FIG. 6C. The raised lip 950 of the wafer chuck 900 enables the puddle process shown in FIG. 10B to form a puddle (P) that completely covers the frontside surface 210 of the semiconductor substrate W.

A wide variety of processing liquids may be dispensed in step 1020 of FIG. 10B, depending on the puddle process being performed on the frontside surface 210 of the semiconductor substrate W. In some embodiments, a cleaning solution or an etching solution may be dispensed in step 1020 to clean or etch the frontside surface 210 when a cleaning or etching puddle process is performed. In other embodiments, a coating material (e.g., a photoresist) and/or a developer solvent may be dispensed onto the frontside surface 210 when performing a photoresist patterning process. Other processing liquids may be dispensed onto the frontside surface 210 of the semiconductor substrate W in step 1020 of FIG. 10B when performing other puddle processes, as is known in the art.

In some embodiments, the puddle formed in step 1020 of FIG. 10B may be dispersed across the frontside surface 210 of the semiconductor substrate W by spinning the wafer chuck 900 at the first rotational speed. In other embodiments, the puddle of the first processing liquid may be dispersed across the frontside surface 210 of the semiconductor substrate W by tilting the wafer chuck 900 while spinning the wafer chuck 900 at the first rotational speed. In some embodiments, the wafer chuck 900 and/or the first processing liquid may be heated to ensure that the puddle of the first processing liquid maintains a uniform temperature across the frontside surface 210 of the semiconductor substrate W during the puddle process.

In some embodiments, the process flow 1000 may process the backside surface 220 of the semiconductor substrate W after the puddle process is performed on the frontside surface 210 of the semiconductor substrate W. For example, the process flow 1000 may dispense a second processing liquid (L2) onto the backside surface 220 of the semiconductor substrate W in step 1030 of FIG. 10C to process the backside surface 220. The second processing liquid (L2) may be dispensed onto the backside surface 220 via the fluid flow channel 930 while the wafer chuck 900 is stationary or spinning at a predetermined rotational speed.

A wide variety of processing liquids may be dispensed in step 1030 of FIG. 10C, depending on the process being performed on the backside surface 220 of the semiconductor substrate W. In some embodiments, a cleaning solution may be dispensed in step 1030 to clean and/or remove contaminants from the backside surface 220 of the semiconductor substrate W. In some embodiments, the contaminants may be deposited onto the backside surface 220 during a previous process performed on the frontside surface 210 of the semiconductor substrate W such as, but not limited to, the frontside process shown and described in reference to FIG. 10B.

Improved wafer chuck designs and methods for retaining a processing liquid on a surface of a semiconductor substrate during a puddle process are described in various embodiments. The semiconductor substrate may include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the systems and methods described herein will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for retaining a processing liquid on a surface of a semiconductor substrate, the method comprising:
   receiving the semiconductor substrate within a first processing chamber, the semiconductor substrate having a frontside surface, a backside surface, a peripheral edge region, a frontside center region that extends from a center of the frontside surface to the peripheral edge region and a backside center region that extends from a center of the backside surface to the peripheral edge region;
   mounting the semiconductor substrate onto a wafer chuck disposed within the first processing chamber, the wafer chuck comprising: (i) a central planar region positioned below the backside center region of the semiconductor substrate, and (ii) an edge support region positioned below the peripheral edge region of the semiconductor substrate;
   activating the wafer chuck to clamp the backside center region of the semiconductor substrate onto the central planar region of the wafer chuck and elevate the peripheral edge region of the semiconductor substrate above the frontside center region of the semiconductor substrate to ensure that the frontside surface of the semiconductor substrate is concave; and
   dispensing a first processing liquid onto the frontside surface of the semiconductor substrate after activating the wafer chuck to form a puddle of the first processing liquid that covers an entirety of the frontside surface;
   wherein said activating the wafer chuck retains the puddle of the first processing liquid on the frontside surface by ensuring the frontside surface of the semiconductor substrate is concave.

2. The method of claim 1, wherein said activating the wafer chuck comprises applying a vacuum pressure or an electrostatic charge to the wafer chuck.

3. The method of claim 2, wherein the wafer chuck activated further comprises a fluid flow channel coupled to the central planar region, wherein the fluid flow channel is used to provide a fluid to, or remove a fluid from, the backside surface of the semiconductor substrate, and wherein the fluid is a gas or a liquid.

4. The method of claim 3, wherein said activating the wafer chuck comprises applying a vacuum pressure to the wafer chuck by removing gas from the backside surface of the semiconductor substrate to generate the vacuum pressure.

5. The method of claim 3, wherein said activating the wafer chuck comprises applying a vacuum pressure to the wafer chuck by providing a liquid to the backside surface of the semiconductor substrate and subsequently removing the liquid to generate the vacuum pressure.

6. The method of claim 2, wherein the edge support region of the wafer chuck comprises an annular support ring or a plurality of support pins, and wherein said activating the wafer chuck further comprises mechanically lifting the annular support ring or the plurality of support pins to elevate the peripheral edge region of the semiconductor substrate above the frontside center region of the semiconductor substrate.

7. The method of claim 1, wherein the first processing liquid is dispensed onto the frontside surface of the semiconductor substrate while the wafer chuck is stationary or spinning at a first rotational speed ranging between 0 to 50 rotations per minute (RPM).

8. The method of claim 7, further comprising dispersing the puddle of the first processing liquid across the frontside surface of the semiconductor substrate by spinning the wafer chuck at the first rotational speed.

9. The method of claim 7, further comprising dispersing the puddle of the first processing liquid across the frontside surface of the semiconductor substrate by tilting the wafer chuck while spinning the wafer chuck at the first rotational speed.

10. The method of claim 7, further comprising heating the wafer chuck to ensure that the puddle of the first processing liquid maintains a uniform temperature across the frontside surface of the semiconductor substrate.

11. The method of claim 7, further comprising dispensing a second processing liquid onto the frontside surface of the semiconductor substrate while spinning the wafer chuck at a second rotational speed, which is greater than the first rotational speed, to remove the first processing liquid from the frontside surface of the semiconductor substrate.

12. The method of claim 11, wherein the first processing liquid comprises an etching solution or a cleaning solution, and wherein the second processing liquid comprises a rinsing solution or a drying solution.

13. The method of claim 11, further comprising spinning the wafer chuck to remove the second processing liquid from the frontside surface of the semiconductor substrate and spin-dry the semiconductor substrate.

14. The method of claim 11, further comprising deactivating the wafer chuck before, during or after dispensing the second processing liquid onto the frontside surface of the semiconductor substrate to release the backside center region of the semiconductor substrate from the central planar region of the wafer chuck, wherein said deactivating the wafer chuck comprises removing a vacuum pressure or an electrostatic charge applied to the wafer chuck.

15. The method of claim 14, wherein the edge support region of the wafer chuck comprises an annular support ring or a plurality of support pins, and wherein said deactivating the wafer chuck further comprises mechanically lowering the annular support ring or the plurality of support pins to release the peripheral edge region of the semiconductor substrate.

16. The method of claim 14, further comprising dispensing a third processing liquid onto the backside surface of the semiconductor substrate after deactivating the wafer chuck to clean the backside surface.

17. The method of claim 16, wherein the first processing liquid comprises an etching solution or a cleaning solution, wherein the second processing liquid comprises a rinsing solution or a drying solution, and wherein the third processing liquid comprises a cleaning solution.

18. The method of claim 16, further comprising spinning the wafer chuck to spin-dry the semiconductor substrate after dispensing the third processing liquid onto the backside surface of the semiconductor substrate.

19. The method of claim 11, further comprising dispensing the second processing liquid onto the frontside surface of the semiconductor substrate while the wafer chuck is stationary or spinning at the first rotational speed to form a puddle of the second processing liquid that covers an entirety of the frontside surface.

20. The method of claim 19, wherein the first processing liquid comprises an etching solution or a cleaning solution, and wherein the second processing liquid comprises a drying solution.

21. The method of claim 19, wherein said dispensing the first processing liquid and said dispensing the second processing liquid are performed within the first processing chamber, and wherein the method further comprises:
 transferring the semiconductor substrate from the first processing chamber to a second processing chamber after dispensing the second processing liquid on the frontside surface of the semiconductor substrate to form the puddle of the second processing liquid;
 wherein said activating the wafer chuck retains the puddle of the second processing liquid on the frontside surface by ensuring the frontside surface of the semiconductor substrate is concave during said transferring.

22. The method of claim 21, wherein the first processing chamber is a wet processing chamber, wherein the second processing chamber is a supercritical processing chamber, and wherein the method further comprises:
 treating a surface of the semiconductor substrate with supercritical carbon dioxide ($CO_2$); and
 drying the surface of the semiconductor substrate.

* * * * *